(12) United States Patent
Gilday et al.

(10) Patent No.: US 7,617,409 B2
(45) Date of Patent: Nov. 10, 2009

(54) SYSTEM FOR CHECKING CLOCK-SIGNAL CORRESPONDENCE

(75) Inventors: David Michael Gilday, Cambridgeshire (GB); Daryl Wayne Bradley, Cambridgeshire (GB); Edmond John Simon Ashfield, Cambridge (GB)

(73) Assignee: ARM Limited, Cambridge (GB)

( * ) Notice: Subject to any disclaimer, the term of this patent is extended or adjusted under 35 U.S.C. 154(b) by 509 days.

(21) Appl. No.: 11/414,551

(22) Filed: May 1, 2006

(65) Prior Publication Data

US 2007/0255974 A1 Nov. 1, 2007

(51) Int. Cl.
G06F 1/04 (2006.01)
G06F 1/12 (2006.01)
G06F 1/00 (2006.01)
H03K 19/00 (2006.01)
H03K 10/096 (2006.01)

(52) U.S. Cl. .............. 713/503; 713/400; 713/500; 713/600; 326/93; 326/96

(58) Field of Classification Search .............. 713/400, 713/500, 503, 600; 326/93, 96
See application file for complete search history.

(56) References Cited

U.S. PATENT DOCUMENTS

| | | | | |
|---|---|---|---|---|
| 6,087,868 A | * | 7/2000 | Millar | 327/156 |
| 6,477,659 B1 | * | 11/2002 | Ho | 713/503 |
| 6,549,881 B1 | * | 4/2003 | Dearth et al. | 703/21 |
| 6,879,195 B2 | * | 4/2005 | Green et al. | 327/147 |
| 6,889,331 B2 | * | 5/2005 | Soerensen et al. | 713/320 |
| 6,983,394 B1 | * | 1/2006 | Morrison et al. | 713/500 |
| 2002/0196052 A1 | * | 12/2002 | Furuya | 326/93 |
| 2004/0130367 A1 | * | 7/2004 | Swarbrick et al. | 327/165 |
| 2006/0182212 A1 | * | 8/2006 | Hwang et al. | 375/354 |

* cited by examiner

*Primary Examiner*—Ji H Bae
(74) *Attorney, Agent, or Firm*—Nixon & Vanderhye P.C.

(57) ABSTRACT

A data processing system is provided having a clock signal comparator comprising a reference input port for receiving a reference clock signal and at least a further input port for receiving respective further clock signal. Checking logic is provided within the clock signal comparator to check for a correspondence between the clock edge of the reference clock signal and a corresponding clock edge of the further clock signal within a predetermined time window. The checking logic is operable to check for the correspondence during operation of the data processing system. The clock-signal comparator can be provided on an integrated circuit or as part of the data processing apparatus having at least two different timing domains such as timing domains associated with two different instances of the same clock. Furthermore the clock-signal comparator is implemented in a hardware description language and integrated in a simulation of the operation of a data processing apparatus to detect timing errors that arise from numerical artifacts of the simulation as well as timing errors that arise from configuration and layout of the circuit elements of the data processing apparatus being simulated.

44 Claims, 15 Drawing Sheets

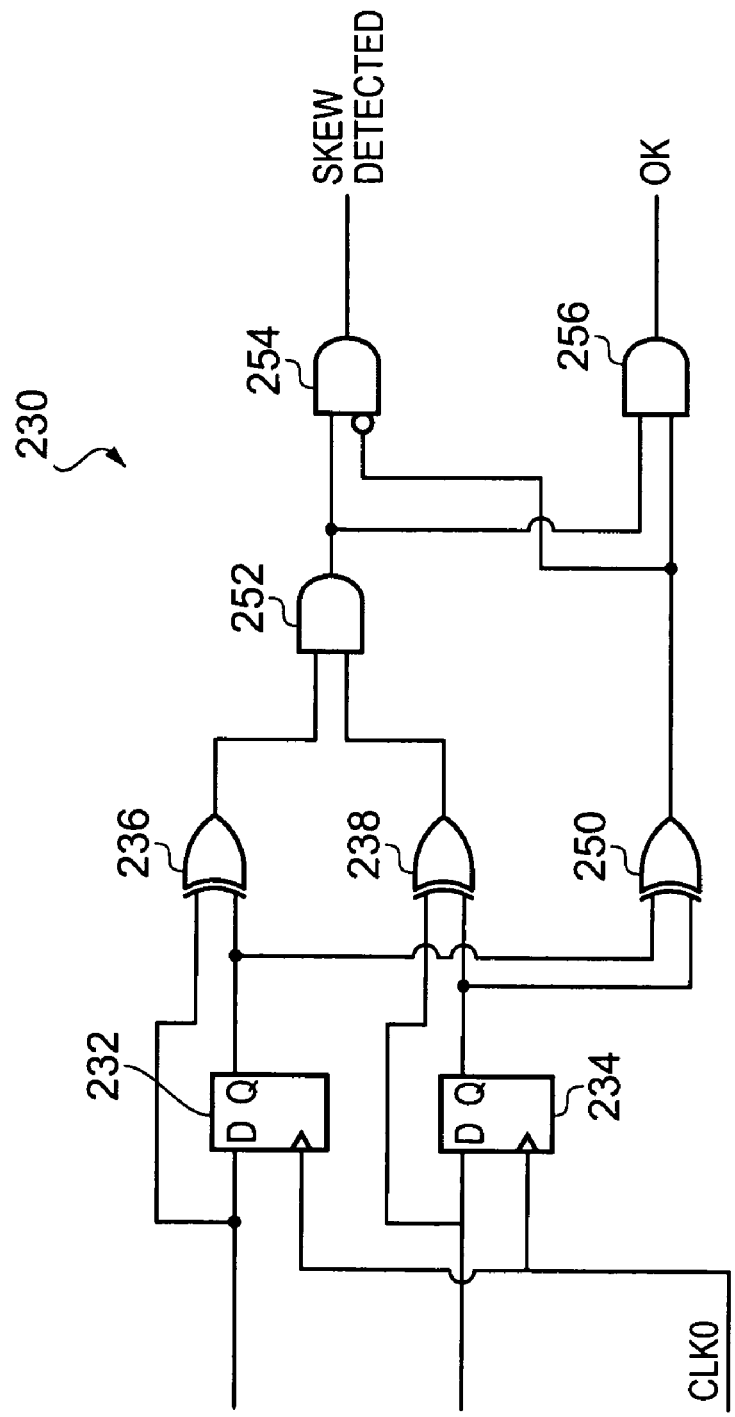

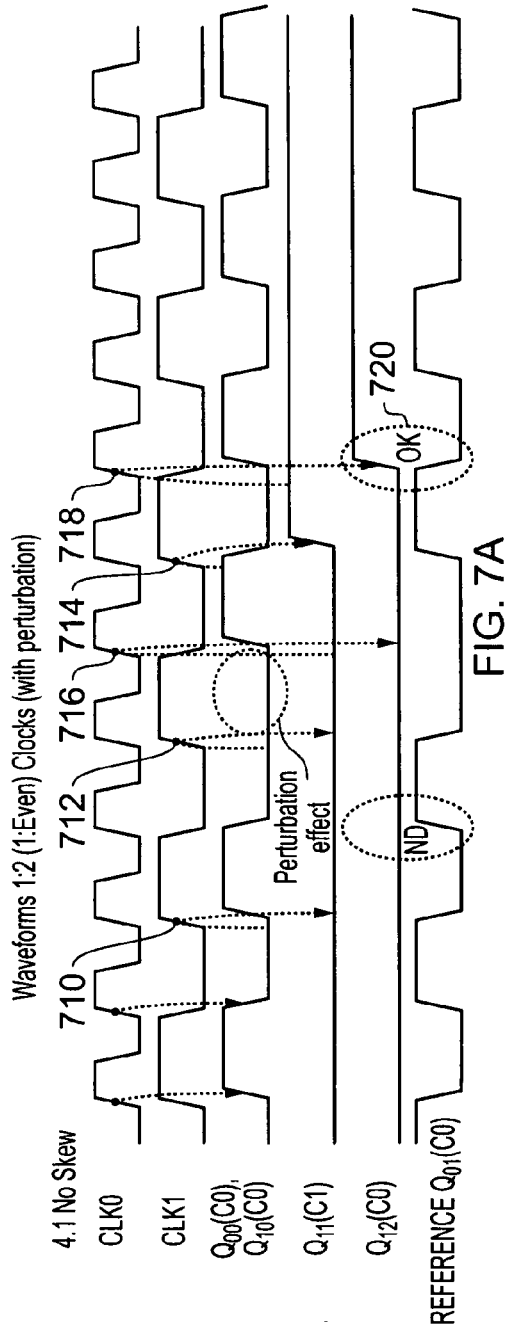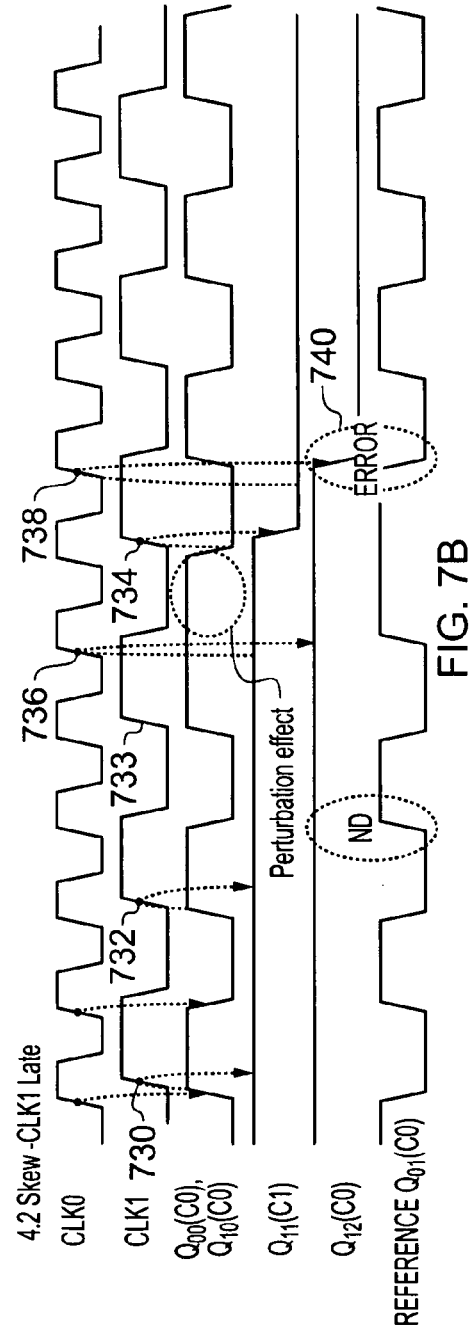

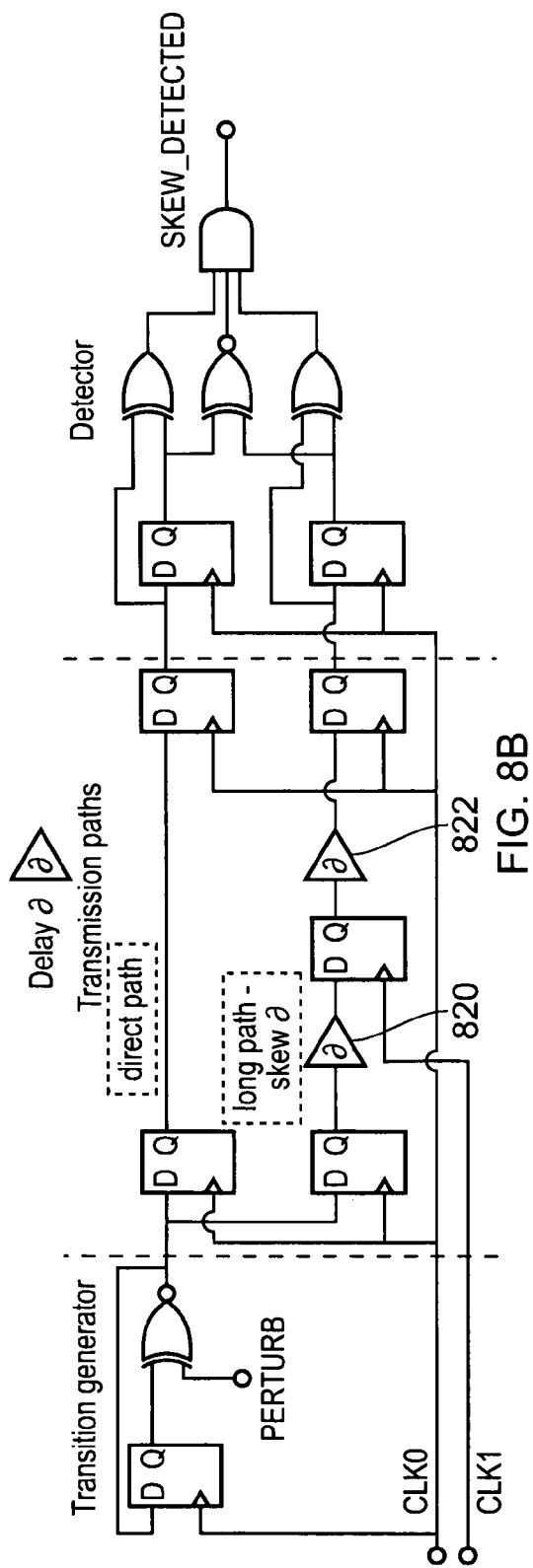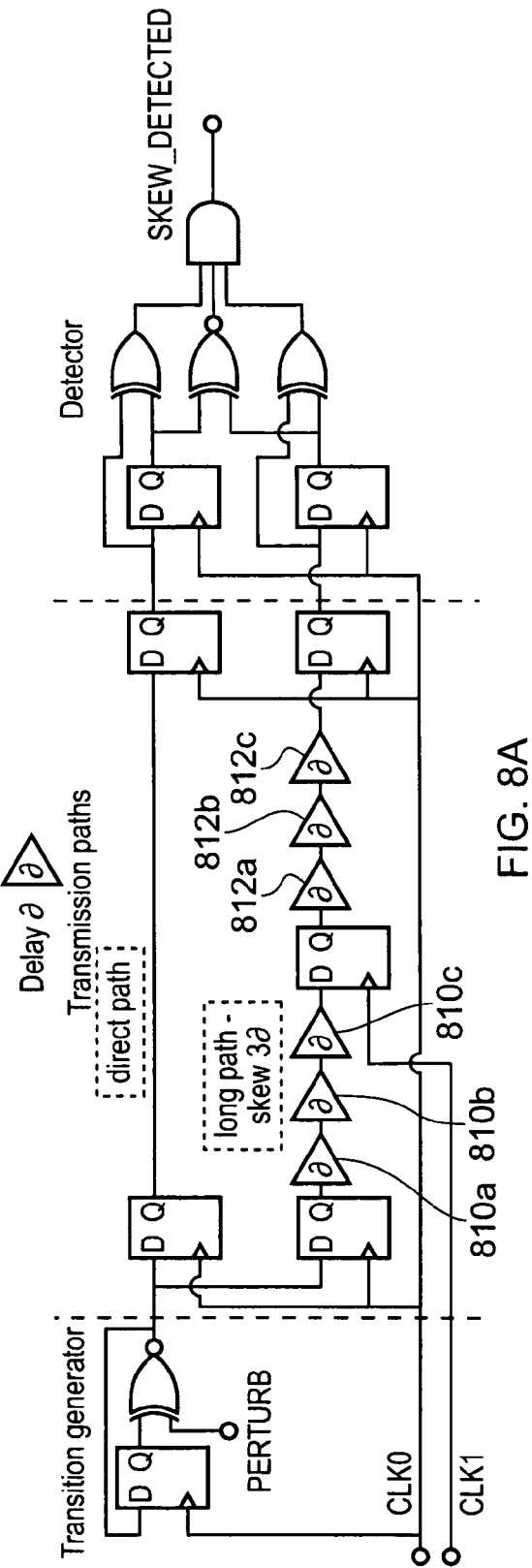

SYSTEM FOR CHECKING CLOCK-SIGNAL CORRESPONDENCE

FIELD OF THE INVENTION

This invention relates to the field of data processing systems. More particularly, this invention relates to checking for correspondence between clock signals.

BACKGROUND

It is known to provide data processing systems such as integrated circuits having processing logic that is sub-divided into several clock domains which require gated or different frequency clocks to be generated and distributed with controlled "clock skew" between them to allow signals to pass between the different clock domains without timing violations. Clock skew is defined herein to be a situation where corresponding rising and/or falling edges of two different clock signals are non-coincident.

It is known in systems such as Field Programmable Gate Arrays (FPGA) to provide a number of low skew global clock buffers with similar distribution insertion delays. However, it is difficult, for example, to generate clocks which are integer divisions of each other frequencies while maintaining low skew between the output clocks. In particular, there is no "clock re-synthesis" or clock balancing included in the known FPGA tools to support this. It is also known to use static timing analysis tools to perform static timing checks that can be used to analyse particular portions of the circuit. However, such static timing analysis tools are not capable of analysing clock paths that are external to an FPGA such as clock paths that are involved in generation and distribution of the clocks via board-level components before those clocks are passed into the FPGA.

Although it is possible to explicitly place circuit elements such as flip-flops and clock buffers to arrange that there is reduced clock skew between generated functional clocks, such fine-tuning of the circuit design is inherently error prone since differing magnitudes of delay could be inadvertently placed in different clock paths resulting in non-negligible clock skew. Furthermore, such a methodology is not easily transferable to different sizes and structures of programmable logic devices.

It is known in systems such as Phase Locked Loop (PLL) clock generators to generate a further clock in dependence upon a reference clock and to modify the relative timings of the clock edges of those two clocks to achieve the desired clock signal profiles. Since the PLL actually generates the clock signals, the signal profiles of those clock signals can be readily controlled by the PLL to reduce any clock skew. However, in data processing devices where the clock signals are externally generated and received as inputs, it is much more difficult to control any clock skew.

Thus there is a requirement for a more efficient mechanism of controlling clock skew between at least two input clock signals that provides reliable clock skew detection and enables the clock skew between different input clock signals to be efficiently controlled.

SUMMARY

According to the first aspect the present invention provides an integrated circuit comprising:

processing logic; and a clock-signal comparator having:
  a reference input port for receiving a reference clock signal;
  at least one further input port for receiving a respective further clock signal; and
  checking logic operable to check for a correspondence between a clock edge of said reference clock signal and a corresponding clock edge of said further clock signal within a predetermined time window;
  wherein said checking logic is operable to check for said correspondence during operation of said integrated circuit.

The present invention recognises that provision of checking logic to check for a correspondence between a clock edge of a reference clock signal and a corresponding clock edge of a further clock signal within a predetermined time window during operation of the integrated circuit allows for more reliable detection of clock skew since the clock skew is dynamically detected and reported. This allows clock skew to be correctly managed and enables effective control of the clock skew in integrated circuits having a range of different sizes and configurations. The present invention has the advantage over static timing checks in that it works for a real silicon implementation of an integrated circuit and checks what is really happening on an individual integrated circuit rather than relying upon tools that have to predict characteristics of the silicon, which may change over the lifetime of an integrated circuit.

Since the checks for correspondence between clock edges are performed dynamically during normal operation of an integrated circuit, they can be used to check for variations in clock skew whilst changes are made to the clocking of the integrated circuit such as the reprogramming of clock dividers or when adjustments to voltages are made in an environment where circuit components are operable to operate at a plurality of different possible operating voltages.

In one embodiment, the checking logic is operable to detect within the predetermined time window at least one of (i) a missing clock edge in the reference clock signal or the further clock signal; and (ii) a time difference exceeding said predetermined time window between an arrival of the clock edge of the reference clock signal and the arrival time of the corresponding clock edge of the further clock signal. This enables any timing differences between clock edges of the further signal clock and the reference signal clock to be flagged in advance and allows any glitches in one of the clock signals that could give rise to incorrect operation of the circuit to be easily detected.

In one embodiment the processing logic comprises a subset of logic clocked by the reference clock signal and a further subset of logic clocked by the further clock signal. The checking logic promotes reliable communication between the processing logic of the first clock domain and the processing logic in the further clock domain, since it enables the integrated circuit to establish when clock edges are coincident, which in turn provides a reliable indication of when synchronous communication should be possible.

It will be appreciated that the checking logic could be operable to provide a straightforward detection of whether at least a predetermined level of clock skew is present or absent. However, in one embodiment the checking logic is operable to detect a plurality of different magnitudes of clock skew (i.e.

non-coincidence between corresponding clock edges of the two clock signals). This provided the flexibility to distinguish between a plurality of different current states of the apparatus. For example, different magnitudes of clock skew can be used to give an indication of when the two clock signals are: (a) properly aligned; (b) almost aligned; or (c) not aligned at all. This has applications, for example, in a situation where a phase lock loop is starting to go out of lock. In this case the window for the "almost aligned" status can be set so that the skew is larger than the skew associated with normal phase lock loop operation, but is small enough to be tolerated by the circuit. The magnitude of clock skew corresponding to the "almost aligned" status can then be used as an intermediate warning signal that could be used, for example, to switch the system into an asynchronous mode before the system actually fails.

It will be appreciated that the checking logic could operate directly on clock edges of the reference signal clock and on clock edges of the further signal clock to look for the correspondence between clock signals within the predetermined time window. However in one embodiment, the checking logic comprises a reference signal path and a further signal path, wherein the further signal path comprises at least one data-capture element clocked by the reference clock signal and at least one data-capture element clocked by the further clock signal. The fact that at least one data-capture element of the further signal path is clocked by the further clock signal enables effective comparison of the clock edges of the further clock signal with the clock edges of the reference clock signal. Furthermore, the use of data-capture elements enables information about the relative timing of clock signals to be logically expressed, which in turn allows the waveforms of the clock signals that are input via the reference input port and the further input port to be manipulated in a manner that enables any non-coincidences in clock edges to be easily detected.

In one embodiment the reference signal path comprises at least one data-capture element clocked by the reference clock. This provides an efficient and convenient reference path for comparing with the further signal path and for revealing any timing inconsistencies that arise from non-coincidence of clock edges of the further clock signal with clock edges of the reference clock signal.

In one embodiment, the at least one data-capture element clocked by the reference clock is operable to capture data on an active edge of the reference clock and the at least one data-capture element clocked by the further clock is operable to capture data on an active edge of the further clock. This enables monitoring of the active edges of the clock signals, which are important for establishing communication between a clock domain clocked by the reference clock signal and a clock domain clocked by the further clock signal.

In one embodiment the active edge is at least one of (i) a negative clock edge; and (ii) a positive clock edge of a corresponding one of the reference clock signal and the further clock signal. This provides for adaptability of the clock-signal comparator for use in assessing and evaluating the effects of clock skew in a different integrated circuits, which could have circuit components that are clocked on rising edges, falling edges or both.

In one embodiment at least one of the data-capture element of the reference signal path and the at least one data capture element of the further signal path comprises an enable input for receiving a respective enable signal. The enable signals indicate which of the clock edges of the respective reference clock signal and the further clock signal are to be used by the integrated circuit for synchronising communication between a domain of the integrated circuit clocked by the reference clock signal and a domain of the integrated circuit clock by the further clock signal. This provides a convenient way of configuring the checking logic to check the clock edges that are significant with regard to reliable operation of the integrated circuit. A common enable signal can be used for all data capture elements having enable inputs or a plurality of independent clock enable signals can be provided to the enable inputs.

In one such embodiment having enable inputs, each enable signal is used to identify active edges of at least one of the reference clock signal and the further clock signal. Thus the enable signal can be conveniently used to define the active edges of the clock on which data values are captured. It will be appreciated that a single enable signal could be used for data capture elements of both the reference signal path and the further signal path. Alternatively, multiple independent clock enable signals could be provided.

In one embodiment the enable signal is synchronous with respect to at least one of the reference clock signal and the further clock signal. This provides a convenient and efficient way of controlling the data-capture time.

In one embodiment at least one of the reference signal path and the further signal path comprises at least one data-delay element for delaying in time an arrival of data at associated one of the at least one data capture elements. Such delay elements can be used to adjust the magnitude of clock skew (i.e. temporal separation of corresponding clock edges of the reference clock signal and the further clock signal) that is detected. The use of different numbers of delay elements in different signal paths allows a plurality of different magnitudes of clock skew to be detected by the checking logic.

It will be appreciated that the data-capture elements could be any one of a number of different devices operable to capture the data, but in one embodiment at least one of the data-capture elements is a flip-flop, for example a master-slave type flip-flop.

In one embodiment the integrated circuit comprises a transition generator operable to send a transition signal along both the reference signal path and the further signal path. The transition signal provides a convenient way of monitoring the effects of any non-coincidence at clock edges of the further clock signal and the reference clock signal since the waveform of the transition signal can be compared on output from the reference signal path and on output from the further signal path and to determine if any clock skew is present.

In one embodiment at least one of the transition generator and the checking logic is clocked by the reference clock signal.

In one embodiment the checking logic is operable to detect a coincidence of a transition associated with said further signal path and a transition associated with said reference signal path. The relative timings of the outputs of the transition edge from the two different signal paths is used to determine how the relative timings of corresponding clock edges of the reference clock signal and the further clock signal along the reference signal path and the further signal path have affected the data-capture times. This in turn enables any clock skew to be efficiently and reliably detected.

In one embodiment the checking logic is operable to detect if a transition edge of the transition signal output by the reference signal path has the same polarity (i.e. the same sense) as a corresponding transition edge of the transition signal output by the further signal path. This provides a convenient way of further distinguishing between waveforms of the output of the reference signal path and the further signal path (in addition to monitoring the actual occurrence times of clock edges). This provides for more flexibility in detection by enabling the circuit elements of the reference signal path and of the further signal path to be suitably adjusted such that detection of clock skew is reliable regardless of the particular frequency ratios or phase differences between the reference clock signal and the further clock signal.

In one embodiment the checking logic is operable to detect if a transition edge of the transition signal output by said reference signal path has a different polarity from a corresponding transition edge of the transition signal output by the further signal path and to output a signal indicating that the clock edge and the corresponding clock edge have different polarities. This provides a convenient way of signalling to other parts of the apparatus that no clock skew is present.

In one embodiment the transition generator is operable to generate the transition signal such that the transition substantially coincides in time with at least one of an active clock edge of the reference clock signal or an active clock edge of the further clock signal. This enables any clock skew to be readily detected.

In one embodiment the transition signal comprises a regular sequence of alternating transitions. This ensures that a condition whereby the transition is output along both the reference signal path and the further signal path to coincide with the arrival of either the reference clock signal or the further clock signal is repeatedly satisfied. This in turn promotes reproducibility of detection of clock skew.

In another embodiment the transition signal comprises a sequence of alternating transitions, but the sequence has at least one perturbation. A regular sequence of alternating transitions may not lead to the reliable detection of clock skew in the cases where: (i) the ratio of frequencies between the reference clock signal and the further clock signal is even; or (ii) where the clock skew is intermittent rather than repeatable. It is desirable to ensure that transitions propagate along the further signal path. In order to ensure this, the data-capture element is clocked by the further clock signal to capture a state at the time of a substantially coincident transition which is opposite from the state captured at the previous further clock signal active edge. To ensure that this condition is met consistently regardless of the ratio between the clock frequencies a perturbation can be used.

In one embodiment the transition generator is operable to generate the perturbation in the transition signal such that a transition occurs substantially coincident with an active edge of said further clock signal such that it has opposite polarity to the most recent preceding transition that was substantially coincident with an active edge of said further clock signal and the level of said transition signal at any intervening active edges of said further clock signal that were not substantially coincident with a transition in said transition signal did not cause a change in the output of the further signal path.

In one embodiment the perturbation an the transition signal is controlled in dependence upon at least one of (i) information with regard to expected timings of clock edges of the further clock and (ii) feedback from the further clock signal indicating timings of clock edges of the further clock. This enables the timing of the perturbation and of the transitions in the transition signal to be conveniently arranged to ensure reliable detection of the clock skew.

In one embodiment the reference clock signal has a reference frequency and a further clock signal has a further frequency, the reference frequency being a non-zero integer multiple of the further frequency. The ability of the checking logic to detect clock skew for a range of different input clock signals having a range of different relative frequencies provides flexibility since the checking logic can be deployed in a wide range of different integrated circuits having different configurations.

In one embodiment at least one of the reference clock signal and the further clock signal is gated for at least one clock cycle. The ability of the checking logic to check for correspondence between clock edges of the reference clock signal and a further clock signal even where one of the clock signals is gated means that the clock-signal comparator can be used even in circuits having one or more gated clock signals.

In one embodiment, one of the reference clock signal and the further clock signal is a gated clock signal whilst the other of these two clock signals is a non-gated clock signal. A gated region of the gated clock signal occurs away from an active edge of the non-gated clock signal.

It will be appreciated that the integrated circuit on which the checking logic is provided could be any type of integrated circuit, but in one embodiment the integrated circuit is a programmable logic device. In one such embodiment, the programmable logic device is an FPGA. Provision of the checking logic in an FPGA is particularly advantageous since the logic elements in an FPGA can be configured in only a limited way since a fixed number of positions are available for inserting certain circuit elements. This makes it particularly advantageous to provide a way of dynamically checking for correspondence between edges of different clock signals to more efficiently evaluate the operation of the circuit in question.

In one alternative embodiment the integrated circuit is implemented in a non-programmable logic device and in another alternative embodiment the integrated circuit is implemented in an Application Specific Integrated Circuit (ASIC).

In one embodiment the further clock signal is generated by a first clock and the reference clock signal is generated by a second clock that is independent from said first clock.

In an alternative embodiment, the further clock signal is generated by a first clock and said reference clock signal is generated by a second clock. The first clock and said second clock are related such that one of the first clock and the second clock is derived from the other of the two clocks.

In a further alternative embodiment one of the first clock and the second clock is a gated version of the other of the two clocks.

In yet a further alternative embodiment, the reference clock signal and the further clock signal are generated at physically different locations in the integrated circuit in dependence upon a common clock.

According to a second aspect the present invention provides a method for detecting a time difference between clock edges in an integrated circuit having processing logic, said method comprising the steps of:

receiving a first clock signal at a first input port;

receiving a second clock signal at a second input port;

checking for a correspondence between a clock edge of said first clock signal and a corresponding clock edge of said second clock signal within a predetermined time window;

wherein said checking is performed during operation of said integrated circuit.

According to a third aspect the present invention provides apparatus for processing data comprising:

a first set of processing logic corresponding to a first clock domain clocked by a first clock signal;

a second set of processing logic corresponding to a second clock domain clocked by a second clock signal;

a frequency controller operable to vary a frequency of at least one of said first clock signal and said second clock signal;

a clock-signal comparator having:
    a first input port for receiving said first clock signal;
    a second input port for receiving said second clock signal; and
    checking logic operable to check for a correspondence between a clock edge of said first clock signal and a corresponding clock edge of said second clock signal within a predetermined time window;
    wherein said checking logic is operable to check for said correspondence during operation of said data processing apparatus.

According to a fourth aspect the present invention provides a computer-readable medium comprising a hardware description model of a circuit in a hardware description language, said hardware description model comprising representations of:

a clock-signal comparator having:
    a reference input port for receiving a reference clock signal;
    at least one further input port for receiving a respective further clock signal; and
    checking logic operable to check for a correspondence between a clock edge of said reference clock signal and a corresponding clock edge of said further clock signal within a predetermined time window;
    wherein said checking logic is operable to check for said correspondence during operation of said circuit.

According to a fifth aspect the present invention provides a computer program for simulating the operation of a data processing apparatus having at least one processing unit, said computer program comprising:
    hardware description language code comprising a plurality of hardware description language code modules representing said at least one processing unit;
    event simulator code operable to execute said hardware description language code to simulate operation of said data processing apparatus and to generate a plurality of signal values and corresponding signal times for a respective plurality of simulated signals;
    one of said plurality of hardware description language code modules representing a processing unit comprising:

a clock-signal comparator having:
    a reference input port for receiving a reference clock signal corresponding to one of said plurality of simulated signals;
    at least one further input port for receiving a respective further clock signal corresponding to a different one of said plurality of simulated signals; and
    checking logic operable to check for a correspondence between a clock edge of said reference clock signal and a corresponding clock edge of said further clock signal within a predetermined time window;
    wherein said checking logic is operable to check for said correspondence when said event simulator code is executing said hardware description language code.

According to a sixth aspect the present invention provides a method for checking for timing errors in a simulation of the operation of a data processing apparatus having at least one processing unit, said method comprising the steps of:
    providing hardware description language code comprising at least one hardware description language code module representing said at least one processing unit;
    executing said hardware description language code on an event simulator to simulate operation of said data processing apparatus and generating a plurality of signal values and corresponding signal times for a respective plurality of simulated signals;
    wherein one of said at least one hardware description language code modules represents a processing unit comprising:

a clock-signal comparator having:
    a reference input port for receiving a reference clock signal corresponding to one of said plurality of simulated signals;
    at least one further input port for receiving a respective further clock signal corresponding to a different one of said plurality of simulated signals; and
    checking logic operable to check for a correspondence between a clock edge of said reference clock signal and a corresponding clock edge of said further clock signal within a predetermined time window; and
    wherein said checking logic is operable to identify said timing errors by checking for said correspondence when said event simulator code is executing said hardware description language code.

Implementation of the clock-signal comparator according to the present technique using a hardware description language for use in simulation of a data processing apparatus enables timing errors that arise due to simulation artefacts to be detected dynamically during the simulation. This has the advantage of making the simulation more reliable in revealing potential errors in operation of the fabricated integrated circuit.

The above, and other objects, features and advantages of this invention will be apparent from the following detailed description of illustrative embodiments which is to be read in connection with the accompanying drawings.

BRIEF DESCRIPTION OF THE DRAWINGS

FIG. 2B schematically illustrates an alternative embodiment for the detector module of FIG. 2A;

FIGS. 7A to 7C schematically illustrate waveforms output by the flip-flops of FIG. 2A for an even clock signal ratio of 1:2 showing the effects of clock skew when there is a perturbation;

FIGS. 8A and 8B schematically illustrate clock skew detectors having signal paths with different numbers of delay elements to detect clock skews of different magnitudes;

DESCRIPTION OF THE PREFERRED EMBODIMENTS

Figure 1:
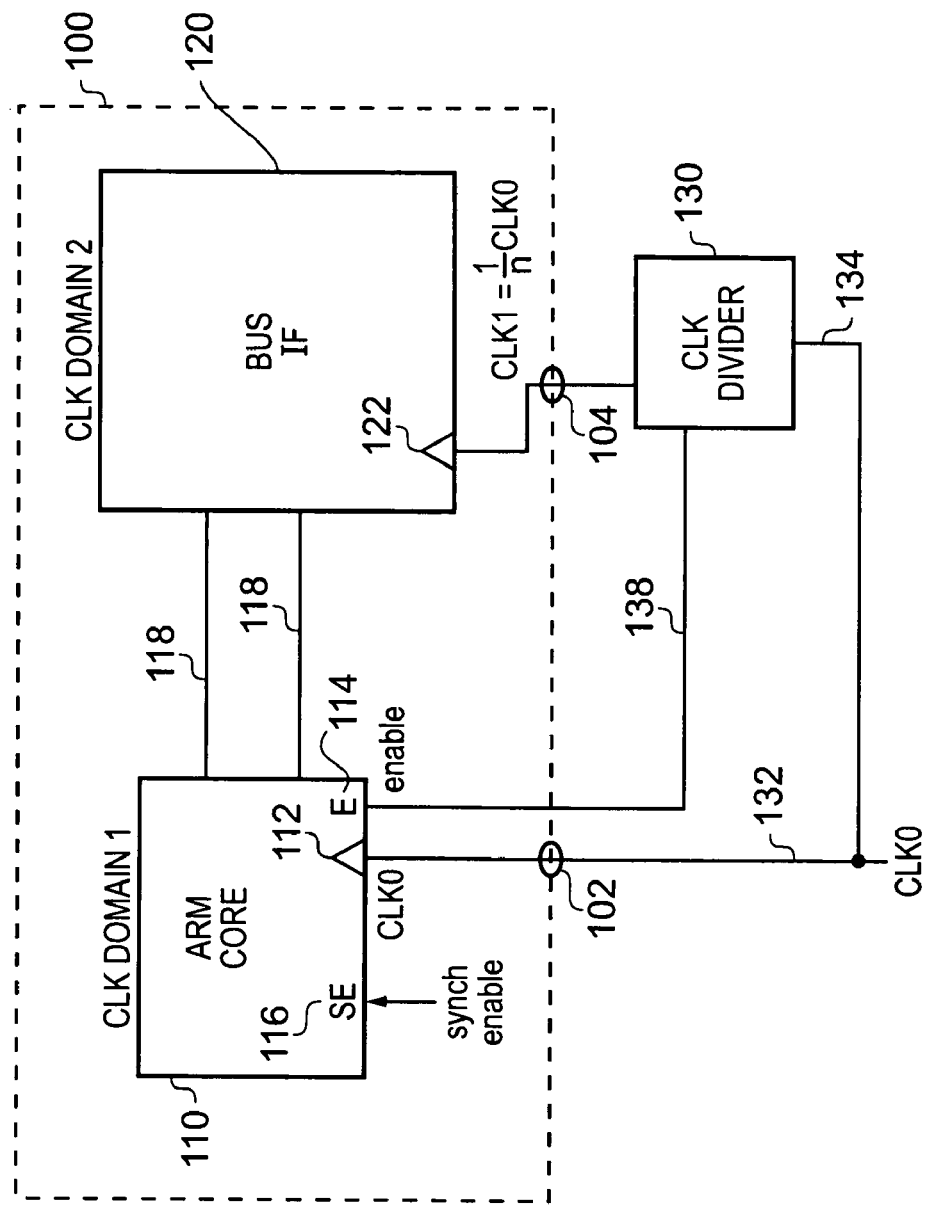
FIG. 1 schematically illustrates a programmable logic device having more than one clock domain.

FIG. 1 schematically illustrates a programmable logic device having more than one clock domain. The system comprises a programmable logic device having an ARM processor core 110 and a bus interface circuit 120 and a clock divider 130, which is situated externally to the programmable logic device. The ARM core 110 and the bus interface 120 communicate via a pair of signal lines 118.

The ARM core 110 has a clock signal input 112, an enable input 114 and a synchronisation (sync) enable input 116. A reference clock signal CLK0 is supplied directly to the clock signal input 112 of the ARM core via a signal line 132. CLK0 is also supplied to the clock divider 130 via the signal line 134. The external clock divider 130 reduces the frequency of the reference clock signal CLK0 (divides frequency by a non-zero integer) and outputs a further (lower frequency) clock signal CLK1 via the signal line 104 to the clock input 122 of the bus interface 120. Thus the ARM core 110 is clocked by the reference clock signal CLK0 whilst the bus interface 120 is clocked by the further clock signal CLK1.

In this particular embodiment, the programmable logic device 100 is an FPGA, but in alternative embodiments it could be a Application Specific Integrated Circuit (ASIC) for some other type of programmable logic device.

The programmable logic device 100 has two associated clock domains i.e. a first clock domain to which the ARM core 110 belongs and a second clock domain to which the bus interface 130 belongs. It will be appreciated that in alternative embodiments the two different clock domains could be derived from any one of the following:

two physically different clocks that are generated independently;
two different clocks, but one of the two clocks is derived from the other of the two clocks;
the same clock, but at physically different locations on the integrated circuit; and
different clocks, where one clock is a gated version of the other clock.

The ARM core 110 is required to be clocked at a higher frequency than the bus interface 120. To enable efficient and reliable communication between the ARM core 110 and the bus interface 120 via the signal lines 118 it is desirable that the reference clock signal CLK0 and the further clock signal CLK1 be generated and distributed with controlled clock skew between them. This allows signals to pass on the signal lines 118 between the two different clock domains without the occurrence of "hold timing violations". Hold timing violations typically occur due to the sampling time being too early or too late relative to the ideal sampling time. In the system of FIG. 1 it is difficult to generate clocks which are integer divisions of each others frequencies whilst maintaining low skew between the output clocks.

The sync enable input 116 of the ARM core 110 is operable to receive a control signal specifying when the clock skew is sufficiently low to enable reliable communication between the ARM core 110 and the bus interface 120 via the signal lines 118. The enable input 114 of the ARM core 110 provides a communication path between the ARM core 110 and the clock divider 130 to enable interface logic (not shown) to the bus interface 120 in the ARM core 110 to be clock gated. The programmable logic device 100 has a reference input port 102 via which it receives the reference clock signal CLK0 and a further input port via which it receives the further clock signal CLK1. Both the CLK0 and CLK1 are generated externally to the programmable logic device. The clock-signal comparator according to the present technique is employed in the system of FIG. 1 to check for correspondence between clock edges of CLK0 and CLK1 within a predetermined time window. Non-coincidence of certain clock edges of CLK0 with corresponding clock edges of CLK1 could preclude synchronous communication between the ARM core 110 and the bus interface 120. The checking logic is operable to check for this correspondence when the ARM core 110 and/or the bus interface circuit 120 are actively performing processing operations. Thus the checking logic is operable to perform checks for clock skew dynamically during normal operation of the programmable logic device 100.

Figure 2A:
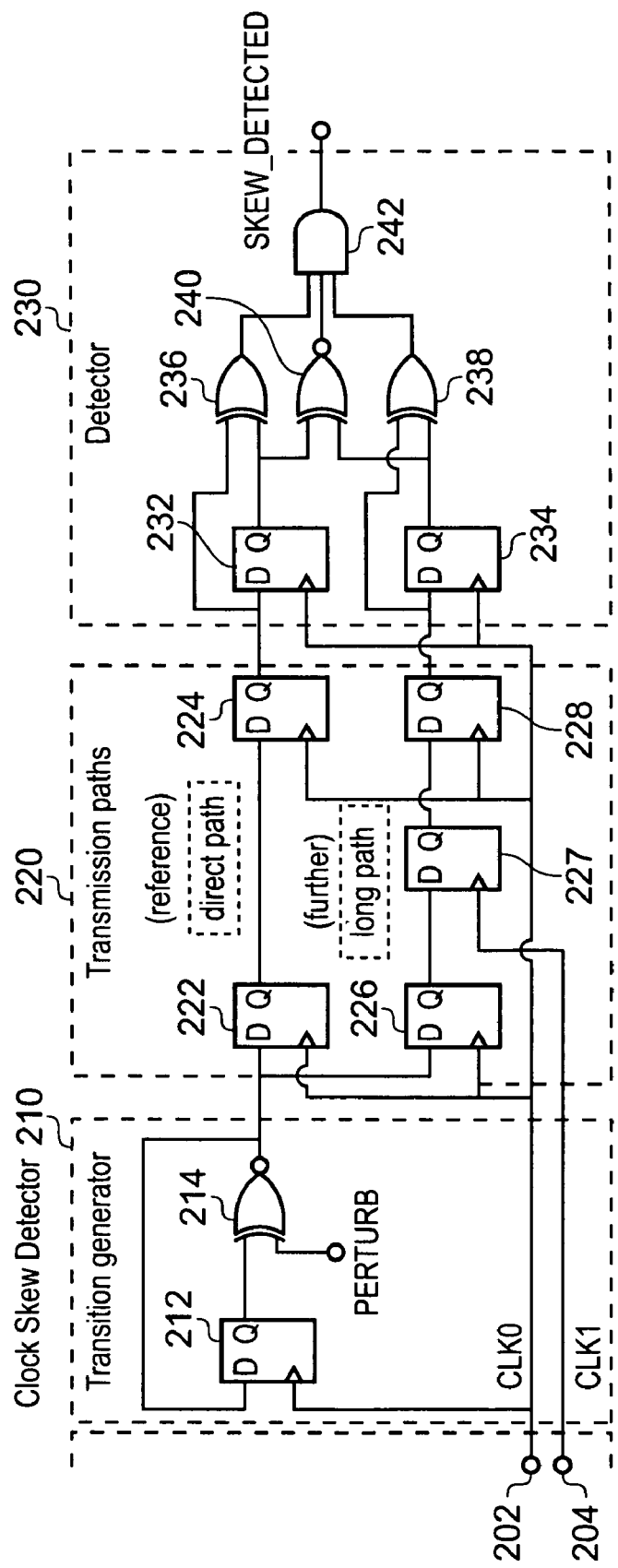
FIG. 2A schematically illustrates checking logic.

FIG. 2A schematically illustrates a clock-signal comparator according to the present technique. The circuitry comprises a reference clock input port 202; a further clock input port 204; a transition generation module 210; a transmission path module 220; and a detector module 230.

The transition generator module 210 comprises a flip-flop 212 and an XNOR logic gate 214. A first input to the XNOR logic gate 214 is a perturbation signal whilst a second input is provided by the Q output of the flip-flop 212. The output of the XNOR gate 214 is fed back to a D input of the flip-flop 212. The flip-flop 212 is clocked by a reference clock signal CLK0.

The transmission path module 220 comprises two distinct transmission paths: (i) a reference path comprising the flip-flops 222 and 224, which are both clocked by the CLK0 and connected in series; and (ii) a further signal path (or long path) comprising two flip-flops 226, 228 that are clocked by the reference clock signal CLK0 and a further flip-flop 227, which is clocked by the further clock signal CLK1. The further flip-flop is situated between the referenced-clocked flip-flops 226, 228, all three flip-flops being connected in series. This additional flip-flop 227 is clocked by a further clock signal CLK1. The reference signal path and the further signal path are parallel signal paths. The output of the XNOR gate 214 of the transition generation module 210 is supplied both to the reference signal path and to the further signal path via the D inputs of flip-flop 222 (reference path) and flip-flop 226 (further path) respectively.

Note that in an alternative arrangement the flip-flops 222 and 226 could be combined such that only a single flip-flop is provided but is operable to supply both the reference path and the third path.

The detector module 230 comprises a first flip-flop 232, a second flip-flop 234, two XOR logic gates 236, 238; an XNOR logic gate 240; and an AND logic gate 242.

The outputs from flip-flops 227 and 228 may exhibit meta-stability due to hold timing violations during occurrences of non-neglibile clock skew. In one alternative embodiment a pair of synchronisation registers is inserted between flip-flops 228 and 234, to ensure that the "Prev" signal of FIG. 10 (described below) is not metastable. In yet a further alternative embodiment, a pair of synchronisation registers is also added between flip-flops 224 and 232 in order to maintain signal alignment between the reference and further signal paths.

The flip-flop 232 is arranged in series with the second flip-flop 224 of the reference signal path such that the D input of the flip-flop 232 receives the Q output of the flip-flop 224.

The XOR logic gate 236 receives the Q output of the reference transmission path flip-flop 224 as a first input and the Q output of the flip-flop 232 as a second input. Accordingly, the XOR gate 236 is operable to detect the occurrence of a transition in the reference signal path. The flip-flop 232 together with the XOR gate 236 can be considered, in view of their combined functions, to be transition detector circuitry.

The flip-flop 234 is arranged in series with the third flip-flop 228 of the further signal path such that the D input of the flip-flop 234 receives the Q output of the flip-flop 228. The XOR logic gate 238 receives the Q output of the further transmission path flip-flop 228 as a first input and the Q output of the flip-flop 234 as a second input. Accordingly, the XOR gate 238 is operable to detect the occurrence of a transition in the further signal path.

The XNOR gate 240 receives as its two inputs (i) the Q output of the flip-flop 232 and (ii) the Q output of the flip-flop 234. This XNOR logic gate 240 is operable to detect whether or not the sense (i.e. polarity) of the transitions on the reference signal path and the further signal path are the same.

The AND gate 242 has three inputs, which are (i) the output of XOR gate 236; (ii) the output of XOR gate 238; and (iii) the output of XNOR gate 240. A high output from the AND gate 242 indicates that clock skew is present whereas a low output indicates that no clock skew is detected.

Note that the flip-flops 222, 224, 226, 227, 228, 232 and 234 are in this particular embodiment D-type flip-flops. Flip-flops of this type are typically used to provide a delay and the logic bit on the D input is transferred to the output at the next clock pulse. Alternative embodiments could have different numbers of flip-flops in the reference signal path and in the further signal path, but the further signal path must comprise at least one flip-flop that is clocked by the reference clock CLK0 and at least one flip-flop that is clocked by the further clock CLK1.

It will be appreciated that the output from logic gate 242 may exhibit metastability and this signal can be synchronised if it is to be used at further locations within the device.

In the embodiment of FIG. 2A, the data capture elements 222, 224, of the reference signal path and data capture elements 226, 228 of the further signal path are clocked by CLK0 and the data capture element 227 of the further signal path is clocked by CLK1 and data is captured on active clock edges corresponding to each rising edge of the corresponding clock signal. However, in alternative embodiments, one or more of the data capture elements of the reference signal path and one or more data capture elements of the further signal path has an enable input for receiving a respective enable signal indicating which of the clock edges are to be used for synchronising communication. In some such embodiments a common enable signal is provided to data capture elements of both signal paths, in other such embodiments one enable signal is provided for the CLK0 clock domain and another enable signal is provided for the CLK1 clock domain. In further alternative embodiments no enable signal is required.

FIG. 2B schematically illustrates an alternative embodiment for the detector module 230 of FIG. 2A. The flip-flops 232 and 234 are identical to those in the detector of FIG. 2A as are the XOR logic gates 236, 238. Thus the XOR logic gate 236 is operable to detect a transition in the reference signal path whereas the XOR logic gate 238 is operable to detect a transition in the further signal path.

The main difference between the detector arrangement of FIG. 2B and that of FIG. 2A is that the arrangement of FIG. 2B is operable to output a signal indicating that there is no clock skew in addition to a signal that indicates that clock skew has been detected. To achieve this an XOR gate 250 is provided and receives as inputs the Q output of flip-flop 232 and the Q output of flip-flop 234 and thus detects a difference in polarity between the edges (transitions) detected by XOR gates 236 and 238.

Outputs of the XOR gate 236 and 238 are supplied to an AND logic gate 252 whose output is subsequently supplied to a further AND gate 254. The output of the AND gate 254 indicates whether or not two transitions of the same polarity have been detected by the XOR gates 236 and 238 and hence skew is detected similarly to the output of gate 242 in FIG. 2A. The second input to the AND gate 254 is the inverted output of the XOR gate 250 that is operable to detect the difference in polarity of the transitions. The AND gate 256 receives as a first input the output of the XOR gate 250 and as a second input the output of the AND gate 252 and outputs an "OK signal" indicating that it has detected on at least one active clock edge of both clocks that there is no skew.

Figure 3:
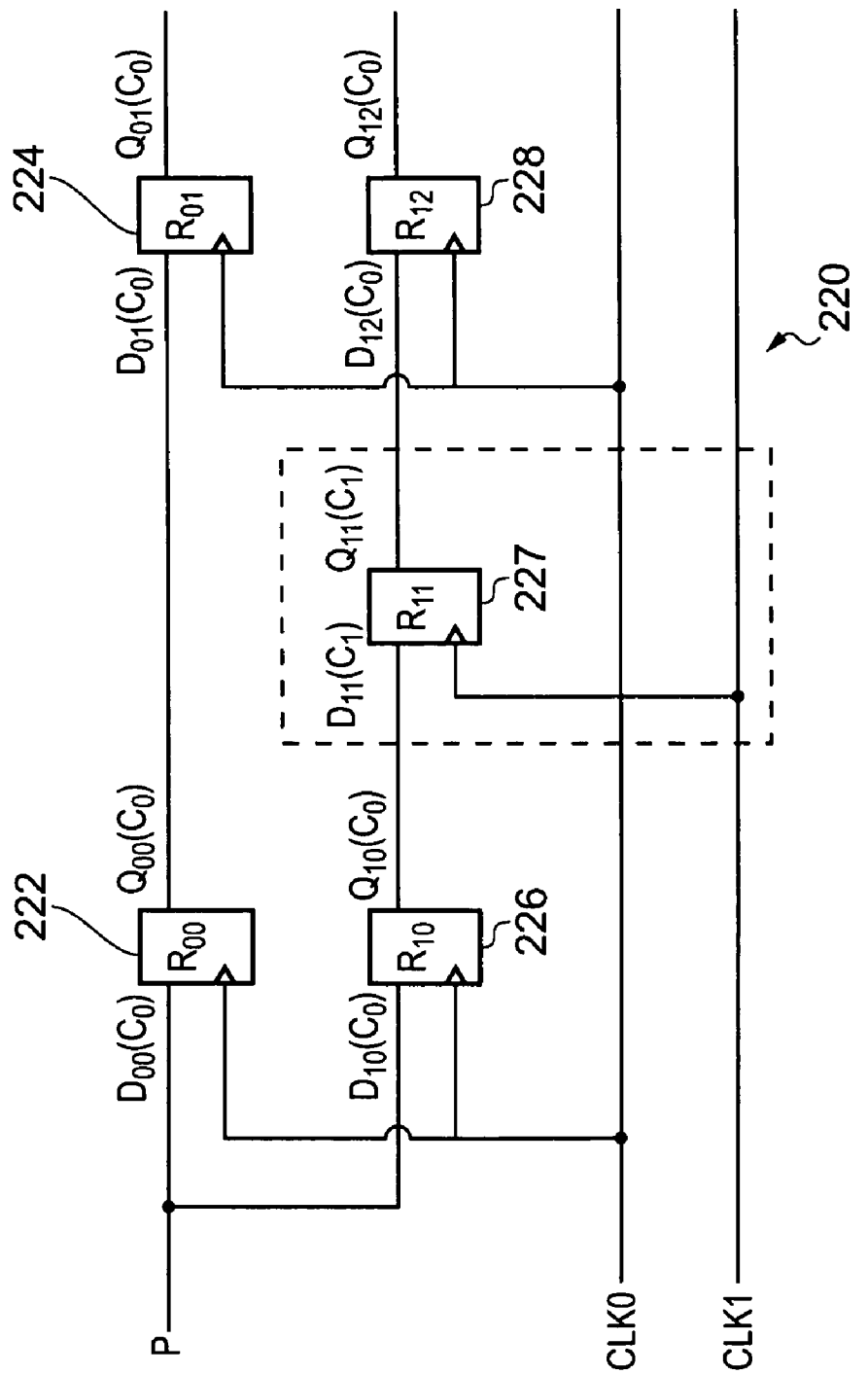
FIG. 3 schematically illustrates in more detail the transmission path module of the circuitry of FIG. 2.

FIG. 3 schematically illustrates in more detail the transmission path module 220 of the circuitry of FIG. 2A. In particular, individual D inputs and Q outputs of each flip-flop 222, 224, 226, 227, 228 have been identified in FIG. 3 and each flip-flop has been identified by a respective register number $R_{ij}$, (i=0,1; j=0,1,2). The particular inputs and outputs as labelled in FIG. 3 will be used for reference when explaining, with reference to FIGS. 4 to 8, how the clock-signal comparator of FIG. 2A operates to detect clock skew.

As shown in FIG. 3, the reference signal path comprises a flip-flop 222, denoted as register $R_{00}$, which has an input signal $D_{00}$ ($C_0$) and an output $Q_{00}$ ($C_0$). The notation $C_0$ has been used here to indicate that the register is clocked by CLK0. The flip-flop 224 has been denoted as register $R_{01}$ and has an input $D_{01}$ ($C_0$) and an output $Q_{01}$ ($C_0$). The first flip-flop 226 of the further signal path is denoted as register $R_{10}$ and has an input $D_{10}$ ($C_0$) and an output $Q_{10}$ ($C_0$); the second flip-flop 227 of the further signal path has been denoted as register $R_{11}$ and receives an input $D_{11}$ ($C_1$) and outputs signal $Q_{11}$ ($C_1$). The third flip-flop 228 of the further signal path has been denoted as $R_{12}$ having an input $D_{12}$ ($C_0$) and an output $Q_{12}$ ($C_0$).

Each of the two flip-flops 222, 226, (i.e. registers) of the transmission path module 220 receives a transition signal from the transition generator 210 of FIG. 2A via its D input. $R_{00}$, $R_{10}$, $R_{01}$, and $R_{12}$ are each clocked by the reference clock signal CLK0. Register $R_{11}$ of the further signal path is the only register that is clocked by the further clock signal CLK1.

Figure 4A:
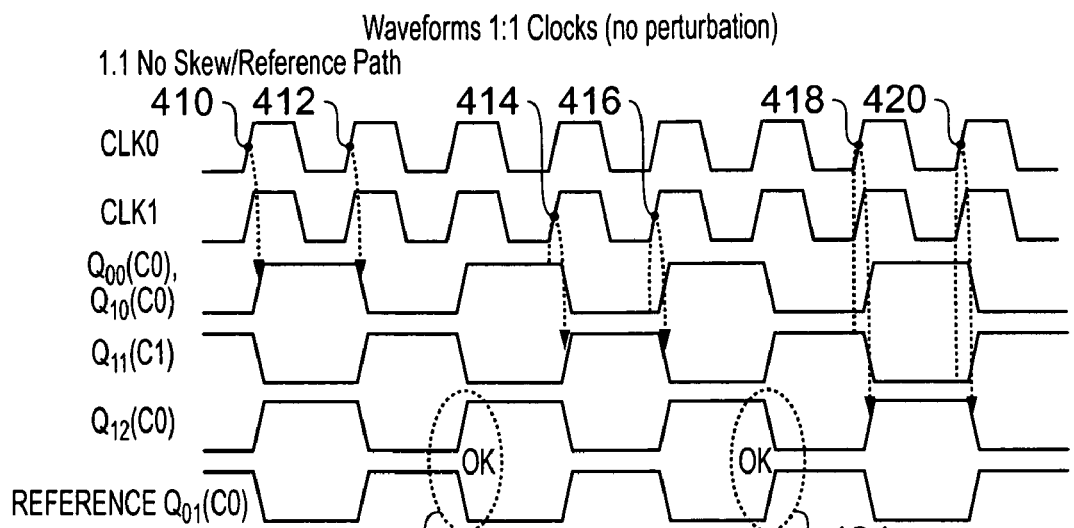
FIGS. 4A to 4C schematically illustrate waveforms output by the flip-flops of FIG. 2A for a clock signal ratio of 1:1 and no perturbation showing the effects of clock skew.

FIGS. 4A, B and C schematically illustrate waveforms of the input/output signals of FIG. 3 in the case where the ratio of the reference clock signal CLK0 to the further clock CLK1 is 1:1 ratio (i.e. have equal frequencies). In this situation no perturbation is needed from the perturbation generator 210 in FIG. 2A.

FIG. 4A shows the waveforms of both clock signals CLK0, CLK1 together with the outputs of each of the registers $R_{00}$, $R_{01}$, $R_{10}$, $R_{11}$ and $R_{12}$ as a function of time. In this particular example, the signals are sampled on the rising edge of the corresponding clock signal i.e. the rising edge is the active clock edge.

Points 410 and 412 on CLK0 are sampling times. It can be seen that at sampling point 410 both $Q_{00}$ ($C_0$) and $Q_{10}$ ($C_0$) exhibit a transition from zero to one (rising edge_whereas at the subsequent sampling point 412 $Q_{00}$ ($C_0$) and $Q_{10}$ ($C_0$) exhibit a transition from one to zero (falling edge).

The waveform for $Q_{11}$ ($C_1$), corresponding to the output of $R_{11}$ is sampled on rising edges of CLK1. This is illustrated by sampling points 414 and 416. In particular, at sampling point 414 the output of the preceding register $R_{10}$ corresponding to signal $Q_{10}$ ($C_0$) is high whereas at the subsequent sampling point 416, the signal $Q_{10}$ ($C_0$) has a low value. This results in the rising edge (sampling point 414) and falling edge (sampling point 416) respectively of the waveform $Q_{11}$ ($C_1$).

The output signal $Q_{11}$ is supplied as input to the register $R_{12}$, which in turn outputs the signal $Q_{12}$ ($C_0$). The waveform for $Q_{12}$ ($C_0$) is also shown in FIG. 4A and sampling points 418 and 420 of the reference clock signal CLK0 illustrate how the profile of the signal $Q_{12}$ ($C_0$) is determined. In particular, at sampling point 418 the output of the preceding register $R_{11}$ (i.e. output signal $Q_{11}$ ($C_1$)) has a high value whereas at the subsequent sampling point 420, the signal $Q_{11}$ ($C_1$) has a low value. It follows that $Q_{12}$ ($C_0$) has a transition from low to high at the sampling point 418 and a transition from high to low at the sampling point 420.

As explained above in relation to FIG. 3, the clock-signal comparator is operable to check for a correspondence between clock edges of the reference signal clock CLK0 and the further signal clock CLK1 by looking for a coincidence in rising and/or falling edges of the waveforms output by the registers $R_{01}$ and $R_{12}$ respectively. In other words, the checking logic performs a check for the coincidence of rising and falling edges in the waveforms $Q_{01}$ ($C_0$) and $Q_{12}$ ($C_0$) in FIG. 4A. $Q_{01}$ ($C_0$) effectively acts as the reference signal against which to check for coincidence of an edge of the waveform for $Q_{12}$ ($C_0$). This is because the coincidence or otherwise of the clock edges will depend upon the sampling time of register $R_{11}$ which is clocked by the further clock signal CLK1, relative to the sampling times of the registers clocked by CLK0.

In the case of FIG. 4A, there is no skew between CLK0 and CLK1 and there is no coincidence between either rising edges (falling edges) $Q_{12}$ ($C_0$) and $Q_{01}$ ($C_0$). In region 422 it can be seen that a rising edge of $Q_{12}$ ($C_0$) occurs at the same time as a falling edge of the reference signal $Q_{01}$ ($C_0$) Similarly, in the region 424, a falling edge of the signal $Q_{12}$ ($C_0$) occurs at the same time as a rising edge of the reference signal $Q_{01}$ ($C_0$). This non-coincidence indicates to the checking logic that there is no skew between the clock signals CLK0 and CLK1.

Figure 4B:
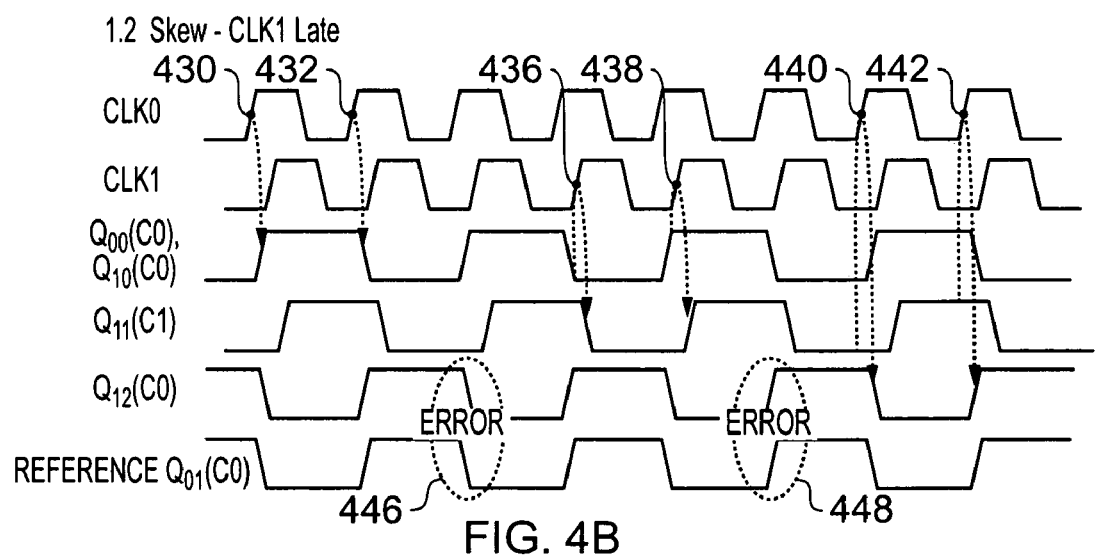

FIG. 4B schematically illustrates the waveforms for the circuit of FIG. 2A where CLK0 and CLK1 have equal frequency, but in the case where the further clock signal CLK1 is slightly late in sampling relative to CLK0 (or equivalently the phase of CLK1 is slightly delayed relative to the phase of CLK0). Sampling points 430 and 432 on rising edges of the clock signal CLK0 are shown in FIG. 4B. Sampling point 430 corresponds to a transition from zero to one in $Q_{00}$($C_0$) and $Q_{10}$($C_0$) whereas the subsequent sampling point 432 corresponds to a transition from one to zero in these two waveforms. The waveform of $Q_{11}$ ($C_1$), which is the output of $R_{11}$, is sampled according to the further clock signal CLK1. The profile of $Q_{11}$ ($C_1$) can be understood, for example, by referring to sampling points 436 and 438 corresponding to adjacent active edges of CLK1. At sampling point 436 the output of the preceding register $R_{10}$ i.e. signal $Q_{10}$ ($C_0$) is low whereas at sampling point 438 the signal $Q_{10}$ ($C_0$) is high. This results in a transition in the waveform $Q_{11}$ ($C_1$) from one to zero at sampling point 436 and a transition from zero to one at the sampling point 438.

The sampling points 440 and 442 of the reference clock CLK0 are used to in FIG. 4B illustrate the profile of the waveform $Q_{12}$ ($C_0$), which is output by $R_{12}$. The values of this output signal at its CLK0 sampling times are determined by the values of the signal $Q_{11}$ ($C_1$) which is supplied as input to the register $R_{12}$. At sampling point 440 $Q_{11}$ ($C_1$) is low whereas at sampling point 442 $Q_{11}$ ($C_1$) is high. Consequently, there is transition from one to zero at sampling point 440 in the waveform for $Q_{12}$ ($C_0$) and a transition from zero to one at the sampling point 442 in the waveform for $Q_{10}$ ($C_0$). In this case, since there is a slight offset between CLK0 and CLK1, the effect is that falling edges of the signal $Q_{12}$ ($C_0$) coincide with falling edges of the reference signal $Q_{01}$ ($C_0$) as shown in region 446 and also rising edges of $Q_{12}$ ($C_0$) coincide with rising edges of the reference signal $Q_{01}$ ($C_0$) as shown in the region 448. The coincidence of corresponding rising edges and the coincidence of corresponding falling edges means that the clock-signal comparator will output a detection result indicating that clock skew is present.

Figure 4C:
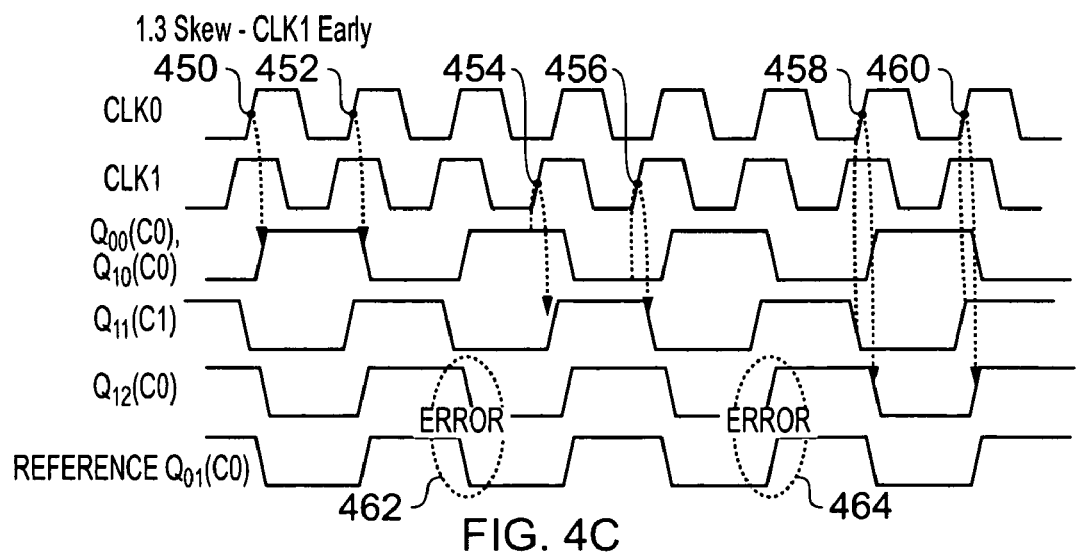

FIG. 4C shows waveforms for outputs of the circuit of FIG. 2A in the case where CLK0 and CLK1 have the same frequency, but where CLK1 is slightly advanced in phase relative to CLK0 (or equivalently CLK1 is slightly early relative to CLK0). Sampling points 450 and 452 corresponding to adjacent rising edges of CLK0 and are sampling points for the signals $Q_{00}$ ($C_0$) and $Q_{10}$ ($C_0$).

The waveform for $Q_{11}$ ($C_1$), which is output by $R_{11}$, is determined by the sampling points specified by CLK1. In particular, at sampling point 454 of CLK1 the signal $Q_{10}$ ($C_0$) which corresponds to the input to the register $R_{11}$ of FIG. 3, is high whereas at sampling point 456, the waveform for $Q_{10}$ ($C_0$) is low and this results in the rising edge at sampling point 454 and the falling edge at sampling point 456 in the waveform for $Q_{11}$ ($C_1$) as shown.

$Q_{12}$ ($C_0$), which is output by $R_{12}$, is sampled in accordance with the reference clock signal CLK0. At sampling point 458 the input to the register $R_{12}$ has just made a transition to a low signal value whereas at the sampling point 460 the input to the register $R_{12}$ has just made a transition to a high value. These transitions are reflected in the waveform of the output of the register $R_{12}$ i.e. the signal $Q_{12}$ ($C_0$) since there is a falling edge of $Q_{12}$ ($C_0$) at sampling point 458 and a rising edge at sampling point 460.

As shown in FIG. 4C, as a result of the clock skew, there is coincidence of falling edges of $Q_{12}$ ($C_0$) with the reference signal $Q_{01}$ ($C_0$) as shown in the region 462 and also a coincidence of rising edges of these two signals as shown in the region 464. The coincidence of corresponding clock edges means that the clock-signal comparator will flag that clock skew is present.

Note that each of FIGS. 4A, B, C show that the waveform for the reference signal $Q_{01}$ ($C_0$) is delayed relative to the output of $Q_{00}$ ($C_0$) by one reference clock signal. This is because the register $R_{00}$ acts as a delay latch.

Figure 5A:
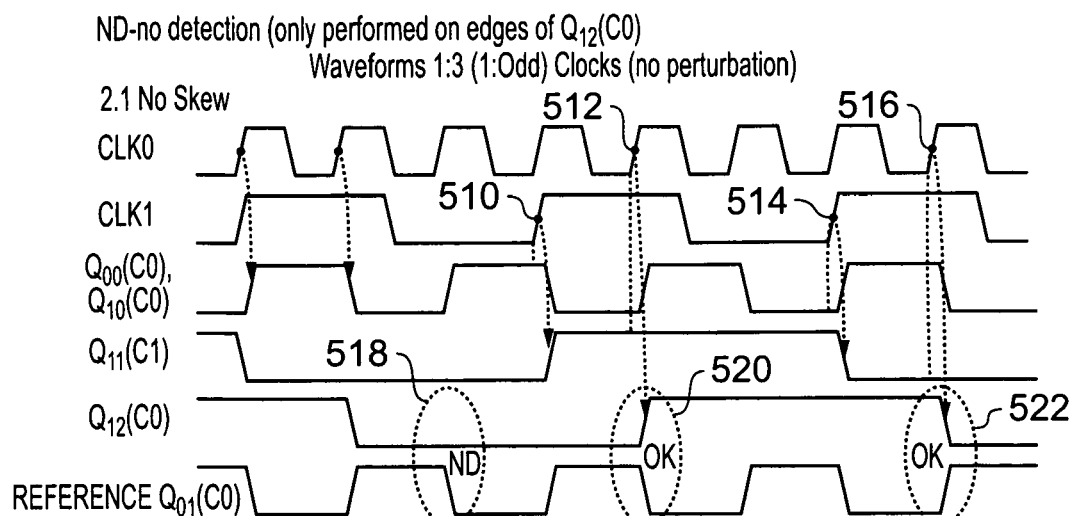
FIGS. 5A to 5C schematically illustrate waveforms output by the flip-flops of FIG. 2A for an odd clock signal ratio of 1:3 and no perturbation showing the effects of clock skew.
Figure 5B:
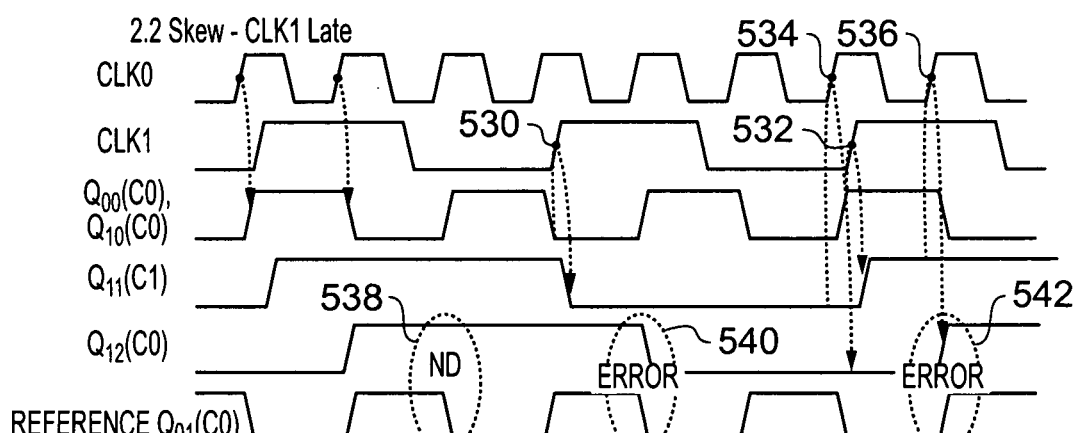
Figure 5C:
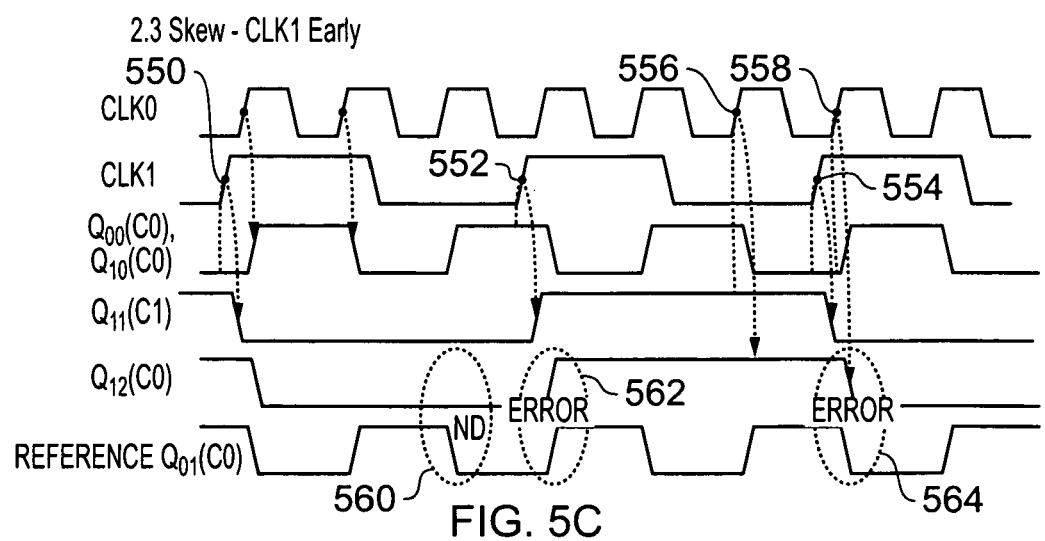

FIGS. 5A to 5C represent the outputs of the circuit of FIG. 2A in the case where there is no perturbation, but CLK1 is only one third of the frequency CKL0 (i.e. the waveforms have a ratio of CLK1:CLK0=1:3, which is an odd ratio).

As shown in FIG. 5A, the signals $Q_{00}$ ($C_0$) and $Q_{10}$ ($C_0$) are sampled on the rising edge of the reference clock signal CLK0. The output $Q_{11}$ ($C_1$) of the register $R_{11}$ can be seen to have transitions of differing duration and differing frequency to the transitions in $Q_{00}$ ($C_0$) and $Q_{10}$ ($C_0$). $Q_{11}$ ($C_1$) is sampled in accordance with the further signal clock CLK1 which is the lower frequency clock. At CLK1 sampling point 510, the input to the register $R_{11}$ (i.e. signal $Q_{10}$ ($C_0$)) has a high value whereas at the subsequent sampling point 514, the input signal $Q_{10}$ ($C_0$) has a low value. This results in a transition from low to high in $Q_{11}$ ($C_1$) at sampling point 510 and a transition from high to low at the sampling point 514.

The output $Q_{12}$ ($C_0$) of the register $R_{12}$ has a signal profile that can be understood by inspection of sampling points 512 and 516 of CLK0. In particular, at sampling point 512 the input to the register $R_{12}$ (i.e. Q11($C_1$)) is high and remains high for all subsequent active edges of CLK0 until the sampling point 516 whereupon $Q_{11}$ ($C_1$) transitions to a low value.

Accordingly the waveform for $Q_{12}$ ($C_0$) has a rising edge at sampling point 512 and the next falling edge occurs at the sampling point 516. Although the clock signals CLK0 and CLK1 have differing frequencies, in the case of FIG. 5A there is no skew. Comparison of the waveforms for the reference signal $Q_{01}$ ($C_0$) and the signal $Q_{12}$ ($C_0$) shows that in region 518 there is no coincidence of edges of the outputs of $R_{01}$ and $R_{12}$. However, in the region 520, the rising edge of $Q_{12}$ ($C_0$) coincides with a falling edge of the reference signal $Q_{01}$ ($C_0$) and at sampling point 522 the falling edge of $Q_{12}$ ($C_0$) coincides with a rising edge of the reference signal $Q_{01}$ ($C_0$). These two regions of coincidence 520, 522 would not be indicative of an error by the clock signal comparator since although the transitions occur at the same point in time the sense of the transitions (or the plurality of the transitions) is not the same. This is detected by the XNOR logic gate 240 in FIG. 2A, which ensures that clock skew is indicated by the output of AND gate 242 only if the coinciding transitions have the same polarity.

FIG. 5B shows the waveforms for a 1:3 clock ratio but in the case where there is non-negligible clock skew. In particular, the further clock signal CLK1 is slightly late relative to CLK0 (or alternatively slightly delayed in phase relative to CLK0). It can be seen that in this case the waveforms for $Q_{00}$ ($C_0$) and $Q_{10}$ ($C_0$) are identical to the case for FIG. 5A. However, the waveform of $Q_{11}$ ($C_1$) differs from the corresponding waveform in FIG. 5A since the sampling points occur at slightly later times. Since $Q_{11}$ ($C_1$) is sampled according to CLK1, it can be seen that at sampling point 530 the signal $Q_{10}$ ($C_0$) (input to the register $R_{11}$) has just made a transition to a low value. It follows that at this sampling point 530 there is a transition in $Q_{11}$ ($C_1$) from high to low at the corresponding time. At the subsequent sampling point 532 on the next rising edge of the clock signal CLK1, $Q_{10}$ ($C_0$) has just made a transition to a high value so there is a corresponding transition from low to high at sampling point 532 in signal $Q_{11}$ ($C_1$).

Signal $Q_{12}$ ($C_0$) is sampled according to CLK0 and two sampling points corresponding to this waveform are shown in FIG. 5B at points 534 and 536. At sampling point 534 the input to the register $R_{12}$ (corresponding to signal $Q_{11}$ ($C_1$)) is low whereas at the subsequent sampling point 536, the input to the register $R_{12}$ is high, so there is a transition from low to high at the sampling point 536 in the signal $Q_{12}$ ($C_0$). Comparison of the outputs of the register $R_{01}$ and $R_{12}$ corresponding to the signals for $Q_{01}$ ($C_0$) and $Q_{12}$ ($C_0$) respectively reveals that in region 538 there is no coincidence of edges in the two signals, but in region 540 there is a coincidence between falling edges of $Q_{12}$ ($C_0$) and $Q_{01}$ ($C_0$) and in region 542 there is a coincidence in rising edges of the two signals. The two coincidences at regions 540 and 542 have the same polarity and accordingly, the checking logic of the circuit of FIG. 2A will indicate that clock skew is present.

FIG. 5C schematically illustrates the waveforms of the outputs of the circuit of FIG. 2A, for a 1:3 clock ratio, but where CLK1 is early relative to CLK0 (i.e. slightly advanced in phase).

The profile of $Q_{11}$ ($C_1$) can be understood by inspecting sampling points 550, 552 and 554. These sampling points correspond to adjacent active edges (in this case rising edges) of the further clock signal CLK1. At sampling point 550 $Q_{10}$($C_0$) (which is supplied as input to $R_{11}$) is low; at sampling point 552 $Q_{10}$($C_0$) is high; and at sampling point 554 $Q_{10}$($C_0$) is low again. Accordingly, the waveform or $Q_{11}$ ($C_1$) has a falling edge at sampling point 550, a rising edge at sampling point 552 and a falling edge at sampling point 554.

The waveform for $Q_{11}$ ($C_1$) in FIG. 5C differs from the waveform for $Q_{11}$($C_1$) in FIG. 5A in that CLK1 arrives early compared to CLK0, $Q_{11}$($C_1$) then transitions low earlier, and this in turn results in $Q_{12}$ ($C_0$) transitioning low as a direct consequence of transition 550. At sampling point 552 $Q_{11}$ ($C_1$) transitions to a high value directly followed by $Q_{12}$($C_0$) transitioning also to a high value due to the early change of $Q_{11}$($C_1$) from the early arrival of CLK1. Accordingly the coincidences between the edges of signal $Q_{12}$ ($C_0$) and the reference signal $Q_{01}$ ($C_0$) differ from the situation in FIG. 5A and FIG. 5B. In particular at region 560 in FIG. 5C, although there is a falling edge in signal $Q_{01}$ ($C_0$) there is no corresponding transition in $Q_{12}$ ($C_0$), but at region 562 there is a coincidence between rising edges of the two signals and at region 564 there is a coincidence in falling edges of the two signals. The checking logic of FIG. 2A will detect these coincidence having the same polarity and will output a result indicating that there is clock skew between CLK0 and CLK1.

Figure 6A:
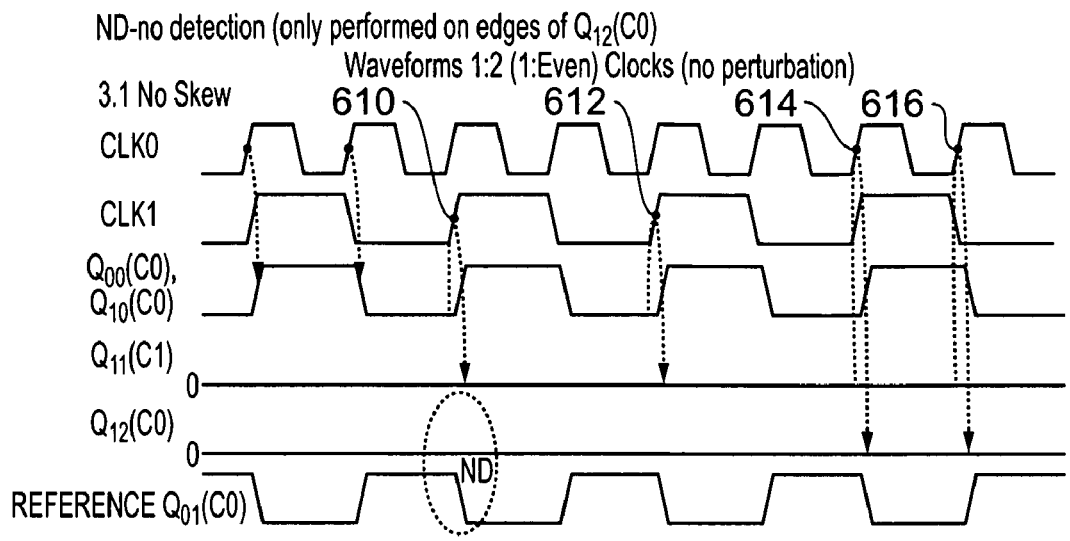
FIGS. 6A to 6C schematically illustrate waveforms output by the flip-flops of FIG. 2A for an even clock signal ratio of 1:2 and no perturbation showing the effects of clock skew.
Figure 6B:
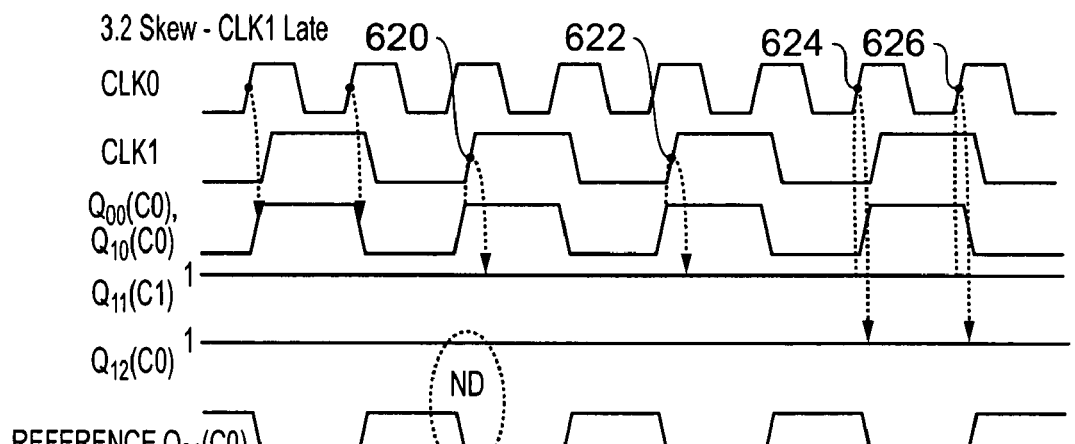
Figure 6C:
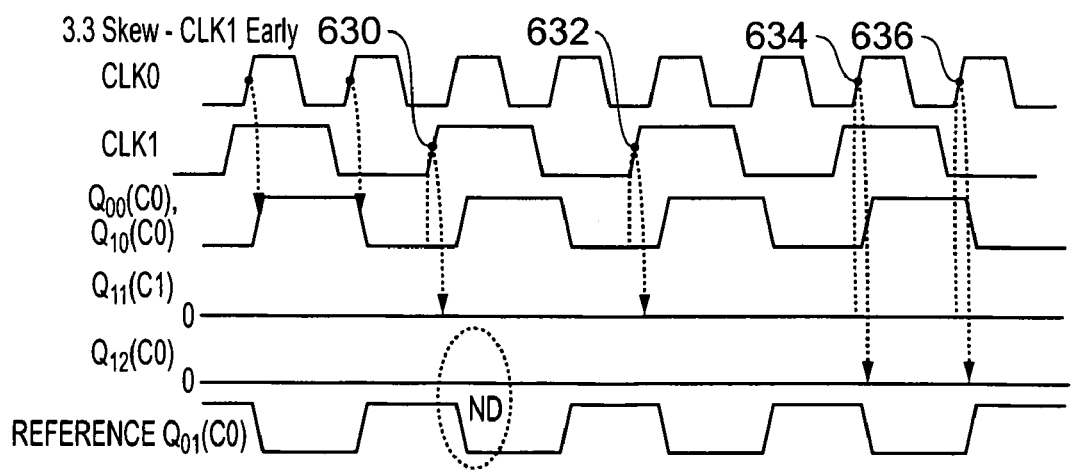

FIGS. 6A, 6B and 6C schematically illustrate waveforms output by registers of FIG. 2A in a case there is no perturbation and where the ratio CLK1:CLK0=1:2 (i.e. an even ratio). A comparison of FIGS. 6A to 6C with the corresponding FIGS. 5A to 5C will show that the requirements for accurate detection of clock skew differ according to whether the ratio between the clock frequencies is even or odd.

In FIGS. 6A, 6B and 6C, the waveforms for $Q_{00}$ ($C_0$) and $Q_{10}$ ($C_0$) are identical since they are determined by the sampling times of CLK0. The waveforms $Q_{00}$ ($C_0$) and $Q_{10}$ ($C_0$) are also identical to the corresponding waveforms in FIGS. 5A to 5C. In FIGS. 5A-C CLK1:CLK0=1:3 (i.e. CLK1 is one third of the frequency of CLK0) whereas in FIGS. 6A-C CLK1:CLK0=1:2. However, the waveforms for $Q_{11}$ ($C_1$) and $Q_{12}$ ($C_0$) will differ between FIG. 5A and FIG. 6A, for example, as a result of the changed CLK1 sampling times.

In FIG. 6A $Q_{11}$ ($C_1$) has a completely flat profile, which can be understood by examining the value of the signal $Q_{10}$ ($C_0$) (input to register $R_{11}$) at sampling points 610 and 612 of CLK1. For example, at sampling point 610 $Q_{10}$ ($C_0$) is low, but it is also low at the adjacent sampling point 612 indeed since all of the CLK1 sampling points coincide with low values of the signal $Q_{10}$ ($C_0$), it follows that $Q_{11}$ ($C_1$) has a completely flat profile. Since $Q_{11}$ ($C_1$) represents the input to register $R_{12}$, the flat profile of $Q_{11}$ ($C_1$) also results in a flat profile for the waveform for $Q_{12}$ ($C_0$). This occurs even in the case of FIG. 6A where there is no clock skew. It will be appreciated that since the profile of $Q_{12}$ ($C_0$) is flat, the checking logic of FIG. 2A will never detect a coincidence in edges of the output signals $Q_{01}$ ($C_0$) and $Q_{12}$ ($C_0$) so the checking logic of FIG. 2A will output a result indicating that no clock skew is detected.

In FIG. 6B there is in fact clock skew between CLK0 and CLK1. In particular, CLK1 has sampling points that are slightly late with regard to the sampling points of CLK0 (or equivalently CLK1 is slightly delayed in phase relative to CLK0). In this case, each CLK1 sampling point for the signal $Q_{11}$ ($C_1$) coincides with a high value of the signal $Q_{10}$ ($C_0$). So similarly to the case in FIG. 5A, the waveform of $Q_{11}$ ($C_1$) has a flat profile but in this case instead of being a constant low value, $Q_{11}$ ($C_1$) has a constant high value. CLK1 sampling points 620 and 622 make this clear.

CLK0 sampling points 624 and 626 are sampling points for the signal $Q_{12}$ ($C_0$). Since the profile of $Q_{11}$ ($C_1$) is constantly at a high value (i.e. logical 1), it follows that regardless of when $Q_{12}$ ($C_0$) is sampled, it will also have a high value. Comparison of the signal $Q_{12}$ ($C_0$) with the reference signal $Q_{01}$ ($C_0$) shows that there can be no detected coincidence in edges of these two signals as a result of the flat profile of $Q_{12}$ ($C_0$). Thus, using this detection scheme (without a perturbation), the clock skew that exists between CLK0 and CLK1 will not be picked up by the checking logic.

FIG. 6C shows the corresponding waveforms for CLK1:CLK0=1:2, but in the case where CLK1 is slightly advanced in phase relative to CLK0. In this case, the CLK1 sampling points 630 and 632, as well as subsequent sampling points correspond to $Q_{10}(C_0)$ having a low value, which results in $Q_{11}(C_1)$ being a constant signal having a low value. Similarly, $Q_{12}(C_0)$ is stuck at a constant zero value (sampling points 634 and 636 correspond to this waveform). Note that the waveforms of FIG. 6C are indistinguishable from the corresponding waveforms of FIG. 6A, regardless of the fact that there is in fact clock skew between CLK0 and CLK1 in FIG. 6C whereas there is no clock skew in FIG. 6A. Thus although the checking for clock skew without using a perturbation gives rise to accurate clock skew detection in the case of FIGS. 5A to 5C for odd clock ratios, it does not seem to give accurate results for even clock ratios.

Figure 7C:
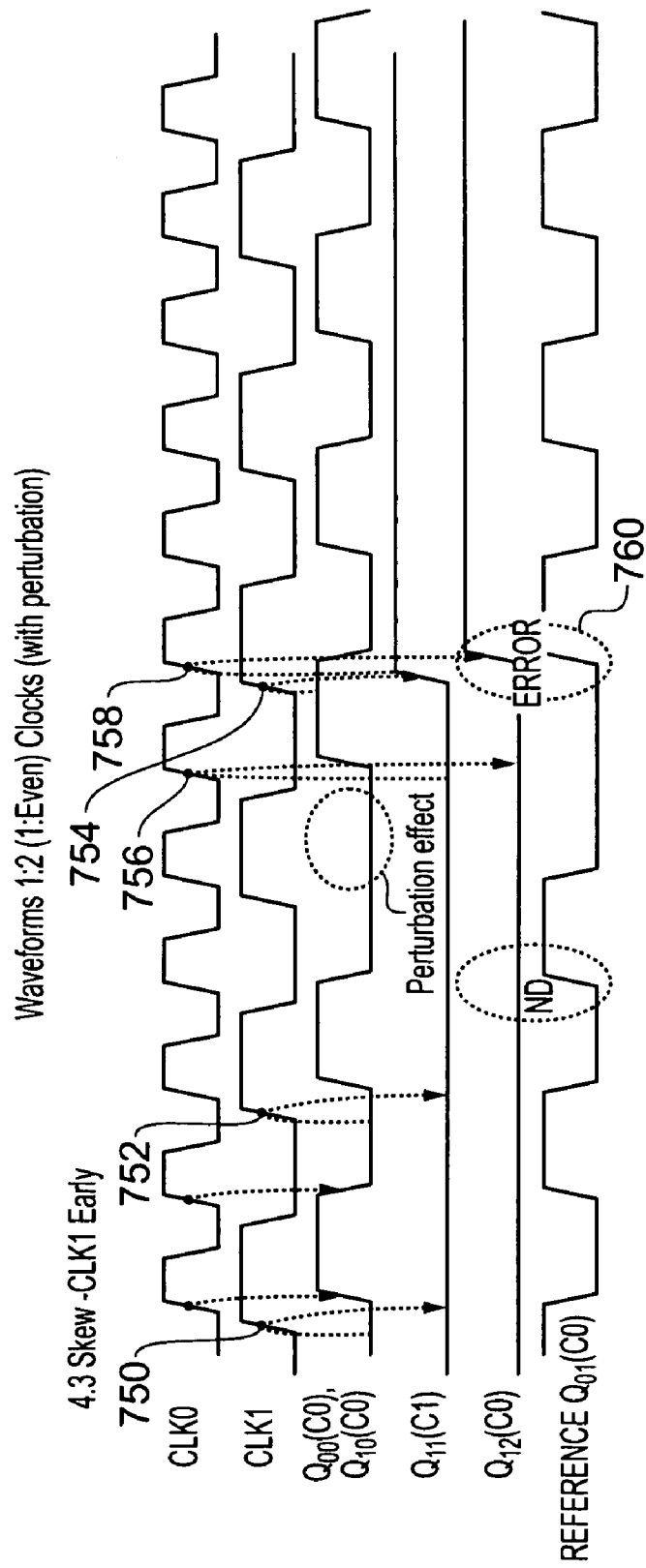

FIGS. 7A to 7C schematically illustrate how the introduction of a perturbation is used to enable the reliable detection of the clock skew in the case where the ratio CLK1:CLK0 is an even ratio.

The reliable detection is effected by introducing a perturbation in the transitioning signal that is input to the register $R_{00}$, which in turn results in a perturbation in the output of $R_{00}$ i.e. $Q_{00}(C_0)$. This same perturbation can be seen in the output of the register $R_{10}$ i.e. this in the signal $Q_{10}(C_0)$. A perturbation is defined to be an induced deviation from a regular waveform. One example of a perturbation is a deviation that causes one or more cycles of the transition signal to be longer or shorter than the standard cycle length or a disturbance that causes the relative durations of the high portion and the low portion within a given transition signal cycle to be altered.

The active edges 710, 712 and 714 of CLK1 correspond to sampling points of the signal $Q_{11}(C_1)$. It can be seen from FIG. 7A that at sampling point 710, $Q_{10}(C_0)$ (i.e. input to the register $R_{11}$) is low and at sampling point 712, $Q_{10}(C_0)$ is again low, but at sampling point 714, $Q_{10}(C_0)$ is high. Thus $Q_{11}(C_1)$ has a low value through sampling points 710 and 712, but makes a transition from low to high at sampling point 714.

With regard to the profile of $Q_{12}(C_0)$, $Q_{11}(C_1)$ is sampled at the CLK0 sampling points 716 and 718. At sampling point 716, $Q_{11}(C_1)$ is low and does not change to a high value until the next but one active edge, which corresponds to sampling point 718. Accordingly $Q_{12}(C_0)$ has a profile such that it is low prior to the sampling point 718, but high subsequent to that sampling point.

The effects of the perturbation can also be seen in the waveform of the reference signal $Q_{01}(C_0)$, but the effects of the perturbation are delayed due to the presence of $R_{00}$. The perturbation is in fact delayed by one reference clock cycle with regard to the perturbation effect seen in $Q_{00}(C_0)$. In this case the perturbation has been to extend in duration the cycle-length of the second illustrated cycle of $Q_{00}(C_0)$ such that the active edge of the further clock signal CLK1 at sampling point 714 coincides with a falling edge of $Q_{00}(C_0)$. The previous transition of $Q_{00}(C_0)$ that coincided with an active edge of CLK1 occurred at the sampling point 710 and this coincident transition was a rising edge of $Q_{00}(C_0)$. Thus the perturbation has been introduced such that the coincident transition has the opposite polarity to the preceding transition. Between the active edge 714, which is the target of the perturbation and the immediately preceding active edge where a coincidence occurred i.e. active edge 710, there is an intervening active edge 712 of the further clock signal CLK1. However, the transition signal $Q_{00}(C_0)$ was low at the intervening active edge 712 and caused no change in the output $Q_{12}(C_0)$ of the further signal path.

Comparison of the signal $Q_{12}(C_0)$ with the reference signal $Q_{01}(C_0)$ shows that several of the rising and falling edges of $Q_{01}(C_0)$ have no corresponding transitions in the signal $Q_{12}(C_0)$. However there is a coincidence of a rising edge of $Q_{12}(C_0)$ with a falling edge of the reference signal $Q_{01}(C_0)$ at the region 720. However, since the polarity of these transitions is not the same, the XNOR gate 240 of FIG. 2A will correctly indicate that there is no clock skew.

FIG. 7B shows the corresponding waveforms in the case where CLK1 is likely to be retarded in phase (i.e. slightly late) relative to CLK0. Again, the effects of the perturbation can be seen in the signal profiles for $Q_{00}(C_0)$ and $Q_{10}(C_0)$. In this case, the perturbation has been introduced such that the high phase of the third illustrated cycle of $Q_{00}(C_0)$ has been extended in duration such that a falling edge in $Q_{00}(C_0)$ coincides with the active edge 734 of the further clock signal. The immediately previous coincidence corresponds to the transition at the active edge between sampling points 732 and 734 at 733, where the active edge of CLK1 coincided with a rising edge of $Q_{00}(C_0)$. Thus the perturbation has resulted in a coincidence that is opposite in polarity to that of the transition signal $Q_{00}(C_0)$ at the immediately preceding coincidence between an active edge and a transition in $Q_{00}(C_0)$. The profile of $Q_{11}(C_1)$ can be understood by looking at the CLK1 sampling points 730, 732 and 734. In particular, at sampling point 730 $Q_{10}(C_0)$ (input to the register $R_{11}$) has just made a transition to a high value and it follows that $Q_{11}(C_1)$ is also high at sampling point 730, the same is true at sampling point 732. However, at sampling point 734, $Q_{10}(C_0)$ has just made a transition to a low value as a result of the perturbation and it follows that $Q_{11}(C_1)$ has a falling edge at the sampling point 734.

The effect of this on $Q_{12}(C_0)$ can seen by looking at CLK0 sampling points 736 and 738. At sampling point 736 $Q_{11}(C_1)$ is high whereas at sampling point 738 $Q_{11}(C_1)$ is low and this results in a transition from high to low in $Q_{12}(C_0)$ at the sampling point 738. Comparison of the reference signal $Q_{01}(C_0)$ with the signal $Q_{12}(C_0)$ shows that although some of the transitions in the reference signal $Q_{01}(C_0)$ are not reflected in $Q_{12}(C_0)$. A clock skew error can still be accurately detected, since the perturbation has given rise to a coincidence of falling edges of $Q_{12}(C_0)$ with $Q_{01}(C_0)$ in the region 740.

FIG. 7C shows the output waveforms for the circuit of FIG. 2A where CLK1:CLK0=1:2 (even ratio) and with a perturbation, but where CLK1 is slightly early (i.e. slightly advanced in phase) relative to CLK0. A perturbation has been introduced such that the low phase of the second illustrated full cycle of $Q_{00}(C_0)$ has been extended. The effect of this is that the active edge 754 of CLK1 substantially coincides with a falling edge of $Q_{00}(C_0)$ In this case, the effects of the perturbation in the signal $Q_{11}(C_1)$ are apparent from the CLK1 sampling points 750, 752 and 754. In particular, $Q_{11}(C_1)$ is low up until the sampling point 754 whereupon a transition from zero to one occurs. The sampling points 756 and 758 of CLK0 show that as a result of this profile of $Q_{11}(C_1)$, corresponding rising edges occurs at a slightly delayed time in $Q_{12}(C_0)$ relative to the time that the respective rising edge that occurs in $Q_{11}(C_1)$. Comparison of the reference signal $Q_{01}(C_0)$ with $Q_{12}(C_0)$ shows that although there is not a corresponding transition for a number of the transitions of the reference signal $Q_{01}(C_0)$, there is in fact a coincidence between rising edges in the region 760 as a result of the perturbation effects. Thus the clock-signal comparator will accurately indicate that clock skew is present, even in this case, where the clock ratio is even.

Thus in the case of FIG. 7B and FIG. 7C where clock skew is in fact present between CLK0 and CLK1, the introduction of the perturbation on input to the checking logic has resulted in coincidence of transition edges of the signals $Q_{01}$ ($C_0$) and $Q_{12}$ ($C_0$), even in the case where the clock ratio is even. In FIG. 7A, where no clock skew is in fact present, here is no coincidence of transitions having the same polarity. Thus it is clear that, for effective detection of clock skew in the case of even clock ratios, the introduction of a perturbation enables the situation where no clock skew is present to be accurately distinguished from the situation where clock skew is present (FIGS. 7B and 7C).

FIGS. 8A and 8B are alternative embodiments to the clock-signal comparator embodiment of FIG. 2A.

FIG. 8A differs from the arrangement of FIG. 2A in that three delay elements 810A, 810B and 810C are inserted in the further signal path (long signal path) between the flip-flops 226 and 227 and a further three delay elements 812A, 812B and 812C are inserted in series between the flip-flops 227 and 228. Similarly in the arrangement of FIG. 8B delay elements are inserted between flip-flops 226 and 227 and between flip-flops 227 and 228, but in this case only a single delay element 820 is inserted between register 226 and register 227 and a single delay element 822 is inserted between registers 227 and 228.

Insertion of different numbers of delay elements on the further signal path allows the clock-signal comparator to detect varying magnitudes of clock skew between the reference clock signal and the further clock signal. In particular, the greater the number of delay elements that are inserted in the further signal path, the greater the magnitude of clock skew needed in order to be detected, i.e. shorter delays elements enable detection of narrower clock skew. It will be appreciated that a single integrated circuit could comprise a plurality of different detection circuits for a respective plurality of different magnitudes of clock skew. Thus, for example, circuits corresponding to the circuit of FIG. 2A together with the circuits of FIGS. 8A and 8B could be included as components of a clock-signal comparator to provide three different levels of clock skew detection. Such a detector would be capable of providing three different status outputs such as:

(i) a "properly aligned" status indicating that the reference clock signal and the further clock signal are properly aligned;

(ii) an "almost aligned" status indicating that the reference clock signal and further clock signal are almost aligned; and (iii) a "not aligned" status indicating that the reference clock signal and further clock signal are not aligned.

Some embodiments have a further "resetting" status value indicating that the checking logic is still calculating after the system was reset. Such circuits operable to detect different levels of clock skew have applications such as in circuits that employ a phase locked loops system. In particular, it can be used to detect when a PLL starts to go "out of lock". In this case, the predetermined time window for the "almost aligned" status is set so that the clock skew is larger than it would be during normal PLL operation, but still small enough to be tolerated by the circuit. The "almost aligned" provides an intermediate warning signal that is used, for example, to switch the system into an asynchronous mode before the clock skew gives rise to system failure.

The different statuses corresponding to the different magnitudes (or levels) of clock skew are also particularly useful in an intelligent energy management environment, where the operating frequency of a processor is selectable from one of a plurality of different performance levels. In this case, clock skew that appears when the system is switching between one operational frequency and another operational frequency can be dynamically detected by the clock-signal comparator. Thus the system can be switched into an asynchronous mode to prevent erroneous communication between two different clock domains when the clock signals mediating communication between the two domains exhibit clock skew.

Figure 9:
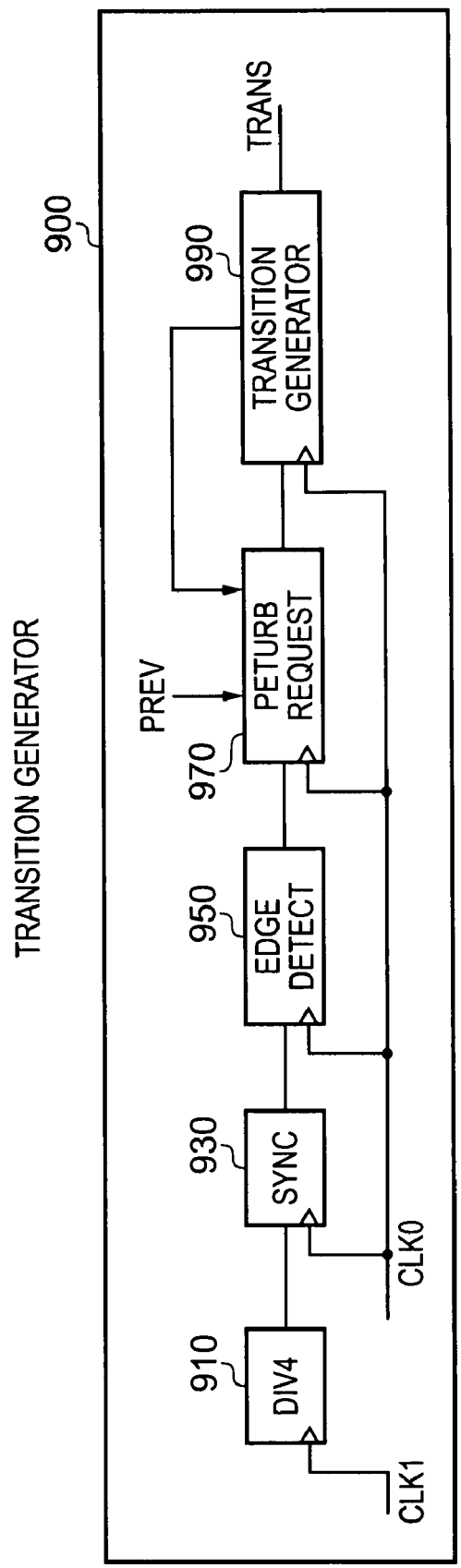
FIG. 9 schematically illustrates a transition generator.

FIG. 9 schematically illustrates circuitry of an embodiment of the transition generation module 210 of FIG. 2A and associated perturb generation. The transition generator 900 of FIG. 9 comprises: a clock divider 910; a sync unit 930; an edge detection unit 950; a perturb request unit 970; and a transition generator unit 990.

The clock divider 910, the sync unit 930, the edge detection unit 950, the perturbation request unit 970 and the transition generator 990 are all arranged in series. The clock divider 910 is clocked by the further clock signal CLK1 whereas all of the other units 930, 950, 970 and 990 are clocked by the reference clock signal CLK0. An output of the transition generator 990 indicates the previous level of the transition signal and is fed back as an input to the perturb request unit 970. The perturb request unit 970 has an input port operable to receive information with regard to previous perturbations to ensure that a transition is introduced into the signals $Q_{11}$($C_1$) and $Q_{12}$($C_0$) in the case where these signals have reached steady state such as when CLK1:CLK0 ratio is even. The transitions are perturbed so that at the next active CLK1 edge following the perturbation there will be a substantially coincident transition with an appropriate polarity which results in a transition being introduced into the previous steady state signal $Q_{11}$ ($C_1$).

Figure 10:
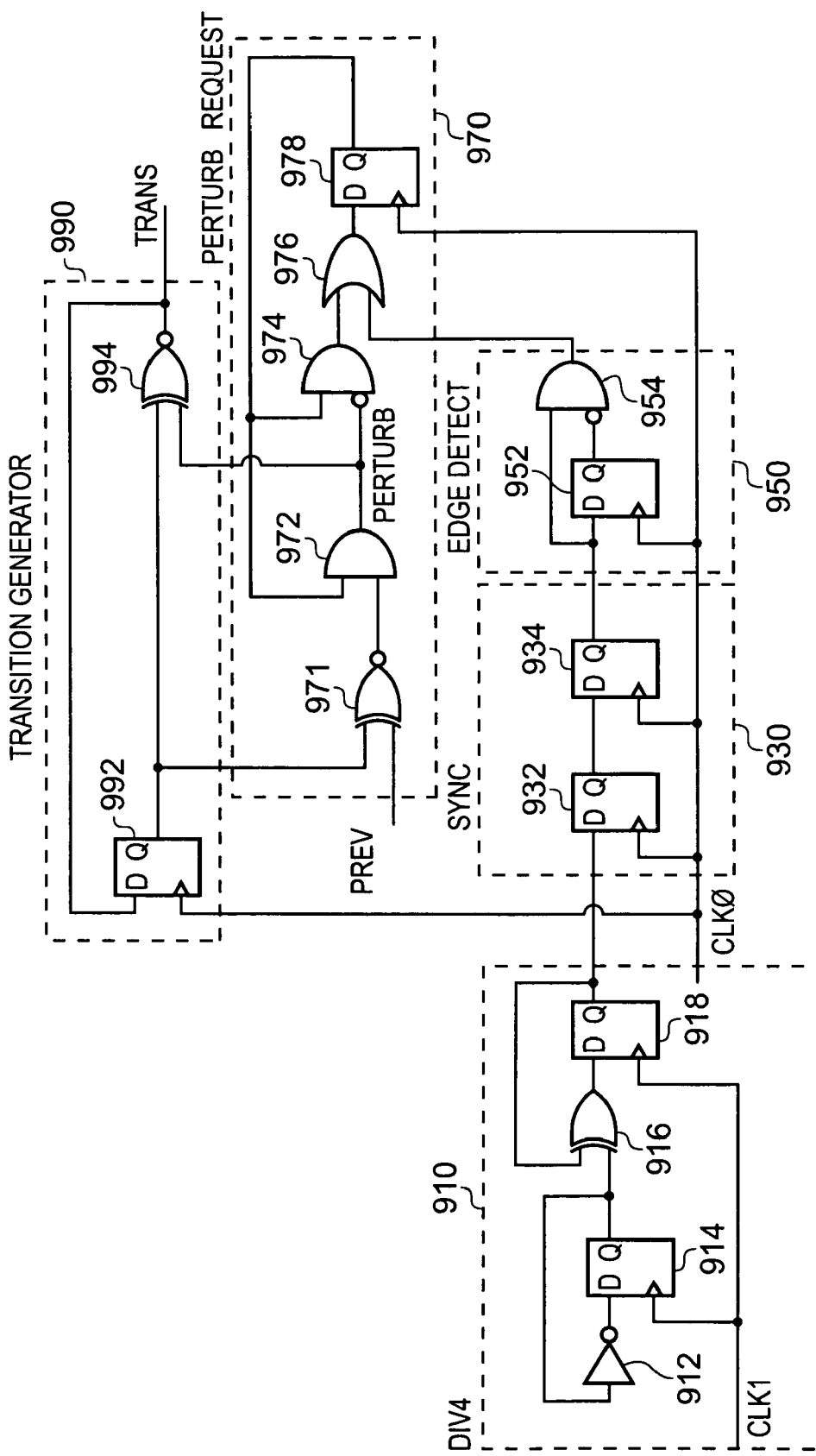
FIG. 10 schematically illustrates in more detail, components of the transition generator of FIG. 9.

FIG. 10 schematically illustrates the transition generator of FIG. 9 in more detail, by showing components of each of the functional units 910, 930, 950, 970, 990.

The clock divider unit 910 is operable to reduce the frequency of the further clock signal CLK1 by a factor of four. This unit comprises an inverter 912; a first flip-flop 914; a XOR gate 916 and a second flip-flop 918. Both flip-flops 914, 918 are clocked by CLK1. The D input of the first flip-flop 914 receives an output of the inverter 912 and the Q output of the first flip-flop 914 is fed back as an input to the inverter 912. The Q output of the flip-flop 914 is supplied as an input to the XOR gate 916, the output of which is supplied to the D input of the second flip-flop 918. The Q output of the second flip-flop 918 is fed back as a second input to the NOR gate 916. The output of the clock divider unit 910 is supplied directly as input to the sync unit 930.

The sync unit 930 comprises a first sync flip-flop 932 and a second sync flip-flop 934 which are connected in series and clocked by the reference clock signal CLK0. These flip-flops 932, 934 synchronise the output of the clock divider unit 910 to CLK0. The output of the sync unit 930 is supplied as input to the edge detection unit 950. The edge detection unit 950 comprises a flip-flop 952 and also an AND logic gate 954. The Q output of the second sync flip-flop 934 is supplied to the D input to the flip-flop 952 of the edge detection unit 950 and is further supplied as an input to the AND logic gate 954. The second input to the AND logic gate 954 is the inverted Q output of the flip-flop 952. The output of the AND logic gate 954 is supplied as an input to the perturb request unit 970 as an edge detect signal.

The perturb request unit 970 comprises an XNOR gate 971 that receives as a first input the Q-output flip-flop 992 of the transition generator unit 990 whereas the second input is a previous $Q_{12}$($C_0$) signal from the further signal path illustrated in FIG. 3. The first AND logic gate 972 receives as a first input the output of 971 and as a second input the output of flip-flop 978. An output of the second AND logic gate 974 is supplied as an input to an OR logic gate 976 and the output of that OR gate 976 is applied to a flip-flop 978 as a D input. The second input to the second AND gate 974 is the Q output of the flip-flop 978 whereas the second input to the OR logic gate 976 is the edge detect signal from the edge detect unit 950. The output of the first AND logic gate 972 is output from the perturb request unit 970 and supplied to the transition generator unit 990 as an input.

The transition generator unit 990 comprises a flip-flop 922 whose Q output is supplied as an input to an XNOR logic gate 994. The output of the XNOR logic gate 994 is fed back as a D input to the flip-flop 992. The flip-flop 992 is clocked by the reference clock signal CLK0. The second input to the XNOR logic gate 994 is the perturb request signal output by the perturb request module 970. The output of the XNOR logic gate 994 is supplied as input both to the reference signal path and to the first signal paths in the arrangement of FIG. 2A.

Figure 11:
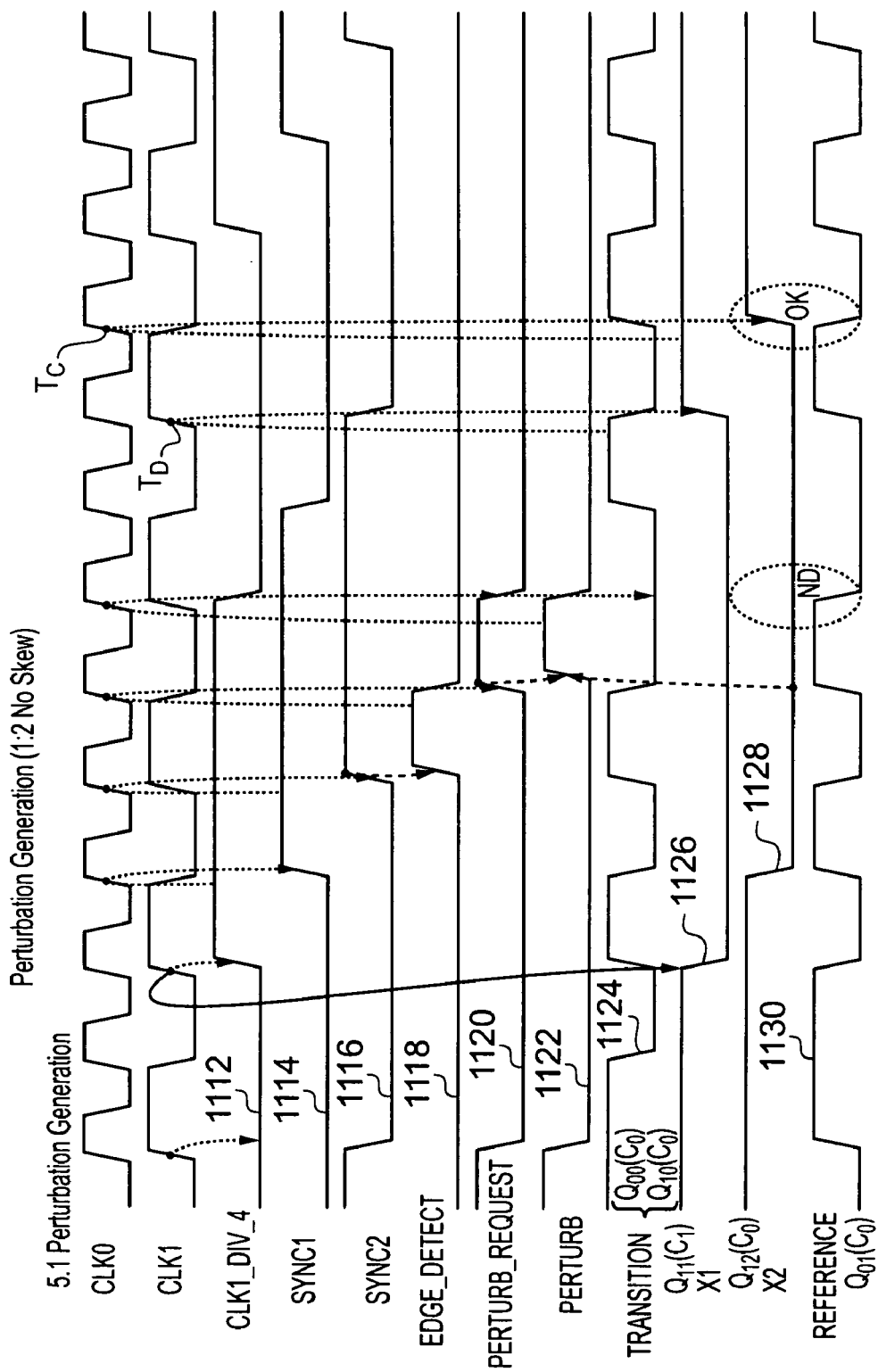
FIG. 11 schematically illustrates perturbation generation for an even clock signal ratio of 1:2 with no clock skew.

FIG. 11 schematically illustrates waveforms output by various circuit elements of the transition generator circuit of FIG. 10. As can be seen in FIG. 11, the reference clock signal CLK0 has twice the frequency of the further clock signal CLK1 and there is no clock skew.

Signal 1112 in FIG. 11 is the output of the clock divider 910 i.e. the output from the flip-flop 918. Since the clock divider 910 of FIG. 10 is driven by the CLK1, signal 1112 is aligned in phase with regard to the further clock signal and has one quarter of the frequency of CLK1. Signal 1114 is the output of the flip-flop 932 of the sync unit 930 of FIG. 10 whilst signal 1116 is the output of the other flip-flop 934 of the sync unit 930. It can been seen that the signal 1116 is delayed by two reference clock cycles CLK0 relative to the signal 1112. This is because the flip-flops 932 and 934 are both clocked by the reference clock signal CLK0.

The signal 1118 in FIG. 11 is the output of the edge detection unit 950 of FIG. 10. In particular, the signal 1118 corresponds to the output of the AND gate 954 of the edge detection unit 950. Signal 1118 effectively indicates the occurrence of an edge in signal 1116 (output by flip-flop 934 of sync unit 930).

Signal 1120 in FIG. 11 is a perturb_request signal that is output by the flip-flop 978 of the perturb request unit 970 of FIG. 10. The perturb_request signal 1120 is delayed by one reference clock cycle CLK0 relative to the edge detection signal 1118. Signal 1122 is a perturb signal, which is the output by AND logical gate 972 of the perturb request circuit 970 of FIG. 10. The perturb signal 1122 is slightly delayed in phase relative to the perturb_request signal 1120.

The resulting transition signal 1224 that is output by the XNOR gate 994 of the transition generator unit 990 is shown in FIG. 11. The effects of the perturb signal 1122 can be clearly seen in the waveform of the transition signal 1124. The purpose of the perturbation (perturb signal 1122) is to ensure that a transition propagates from the transition signal 1124 to $Q_{11}(C_1)$ signal 1124 at the next clock edge, rather than $Q_{11}(C_1)$ 1124 remaining at a constant level, as otherwise happens when the CLK1:CLK0 ratio is even. For this to occur there should be a transition at the next active edge of CLK1 which has a polarity opposite to the polarity of transitions around the previous active edges of CLK1 which resulted in the signal $Q_{11}(C_1)$ becoming steady state. The perturbation is introduced when the level of the transition signal is the same as the steady-state to ensure that $Q_{11}(C_1)$ remains at the same constant level until the subsequent coincidence of a transition of opposite polarity with the next active edge of CLK1. For example, for a clock ratio of 1:8, the perturbation can occur well away from a CLK1 edge, but still results in the polarity of the transitions in signal 1124 changing as required. Thus, it is not the perturbation per se that should coincide with CLK1 to achieve accurate clock skew detection in the case of even clock ratios, but rather that at the next active edge of CLK1 there should be a transition of appropriate polarity.

The signal 1126 in FIG. 11 corresponds to the output signal $Q_{11}(C_1)$ in FIG. 2A whilst the signal 1128 in FIG. 11 corresponds to the output signal $Q_{12}(C_0)$ in FIG. 3. In the $Q_{11}(C_1)$ signal, it can be seen that at the sampling time $T_P$ this signal exhibits a rising edge as a result of the perturbation in the signal 1124. The polarity of the edge in $Q_{10}(C_0)$ is arranged to correspond with sampling point Tp so that a transition is introduced into $Q_{11}(C_1)$ The signal 1130 is a reference signal corresponding to signal $Q_{01}(C_0)$ of FIG. 3 and signal 1128 corresponding to $Q_{12}(C_0)$. Comparison of these two signals reveals that although for some edges of the reference signal 1130 (which also shows the perturbation) there is no corresponding transition in $Q_{12}(C_0)$ 1128, there is coincidence of a rising edge in $Q_{12}(C_0)$ with a falling edge of the reference signal $Q_{01}(C_0)$ at the time point $T_C$ as shown in FIG. 11. However there is no coincidence between transitions having the same polarity. Accordingly, the clock-signal comparator indicates that no clock skew is detected.

Figure 12:
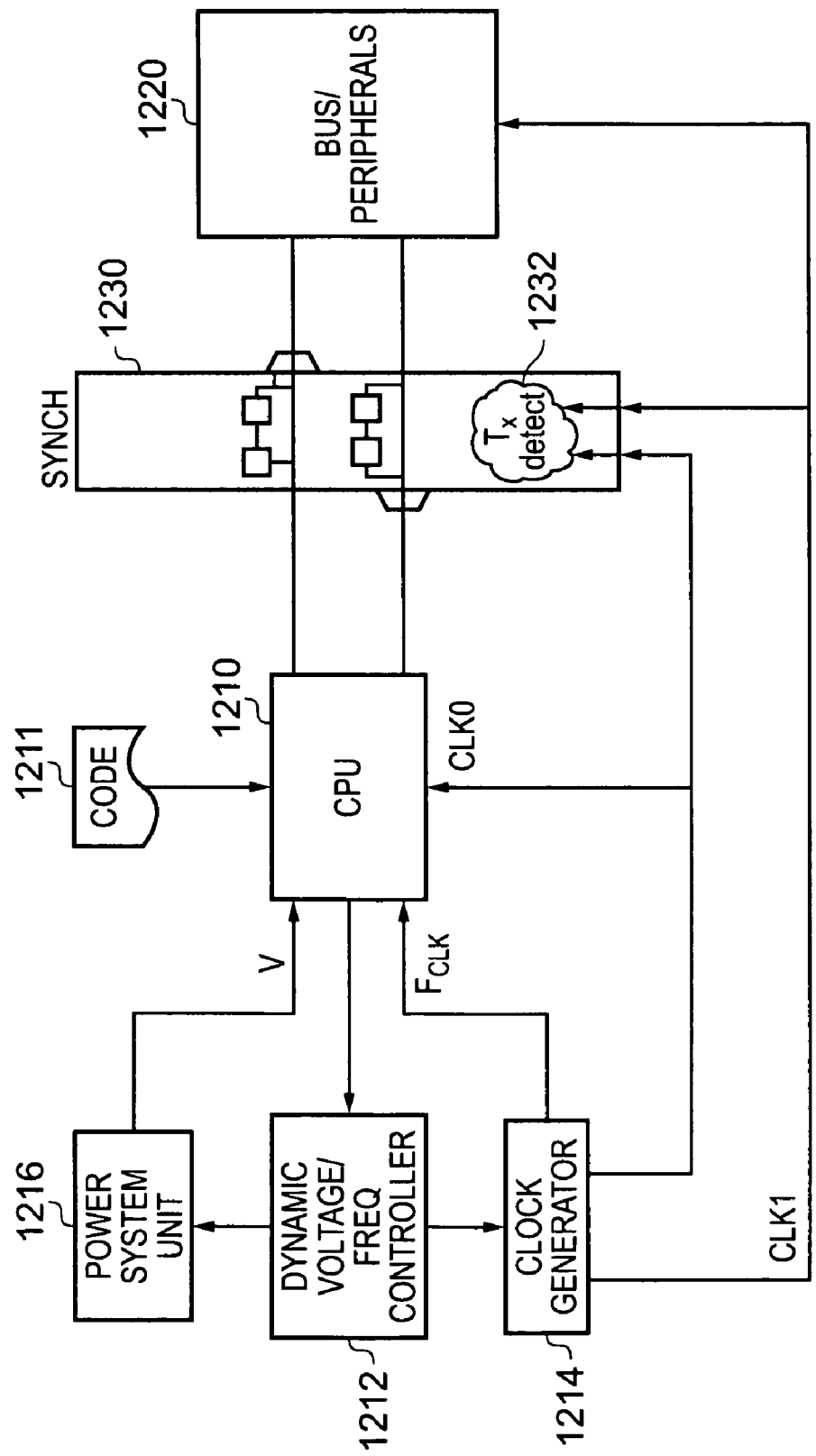
FIG. 12 schematically illustrates a data processing system having two different clock domains and in which one of the clocks is selectively operable to work at a plurality of different clock frequencies (corresponding to a respective plurality of operating voltages)

FIG. 12 schematically illustrates a data processing apparatus comprising sets of processing logic operable in two different clock domains. In this particular embodiment the data processing apparatus comprises an intelligent energy management system in which a Central Processing Unit (CPU) is operable to run at a plurality of possible different frequencies according to the current computational requirements of the system. The apparatus of FIG. 12 comprises: a CPU 1210; a dynamic voltage/frequency controller 1212; a clock generator 1214; and a power system unit 1216. All of these components belong to a first clock domain and are clocked by a reference clock signal CLK0. The apparatus further comprises a bus interface 1220 which is clocked by a further clock signal CLK1. Accordingly the CPU 1210 corresponds to the reference clock domain whereas the bus interface 1220 corresponds to the further clock domain.

Similarly to the system of FIG. 1, in alternative embodiments of the system of FIG. 12, the two different clock domains could be derived from: (i) two physically different clocks that are generated independently; (ii) two different clocks, but one of the two clocks is derived from the other of the two clocks; or (iii) different clocks, where one clock is a gated version of the other clock.

A synchronisation unit 1230 is operable to enable communication across the asynchronous boundary between the two different clock domains and thus enables communication between the CPU 1210 and the bus interface 1220.

The CPU 1210 sends information to the dynamic voltage/frequency controller 1212 to indicate the current workload. The dynamic voltage/frequency controller 1212 can then set the current operational frequency in accordance with the current processing workload by sending control signals to the clock generator 1214 and power system unit 1216. The power system unit 1216 supplies an operational voltage to the circuitry of the CPU 1210. It will be appreciated that the operational frequency and operational voltage are inter-related.

In this particular arrangement, the bus interface operates in accordance with a further clock signal CLK1 which is not varied. The CPU 1210 is operable to execute computer program code 1211. When there is no clock skew between CLK0 and CLK1 efficient communication across between the CPU 1210 and the bus interface 1220 is possible via the synchronising unit 1230. However, if there is significant skew between the clock signals CLK1 and CLK0, then efficient communication is unlikely to be achievable in a synchronous mode.

Non-zero clock skew is likely to arise when the dynamic voltage/frequency controller 1212 has initiated a change in the current operating frequency and is likely to occur in a time window centred upon this change in operating frequency. In this particular arrangement, a clock-signal comparator 1232 according to the present technique is incorporated within the synchronisation unit 1230 and performs checks for coincidence between edges of the clock signal CLK0 and CLK1. When these two clocks are synchronised improved cross-domain performance is achieved, but when clock skew is present the clock-signal comparator in the synchronisation unit 1230 dynamically detects it this and triggers the system to automatically switch to an asynchronous mode. Thus synchronisers between the CPU 1212 and the bus interface 1220 are dynamically enabled and disabled dependent upon any detected skew between the clock signals CLK0 and CLK1.

Figure 13:
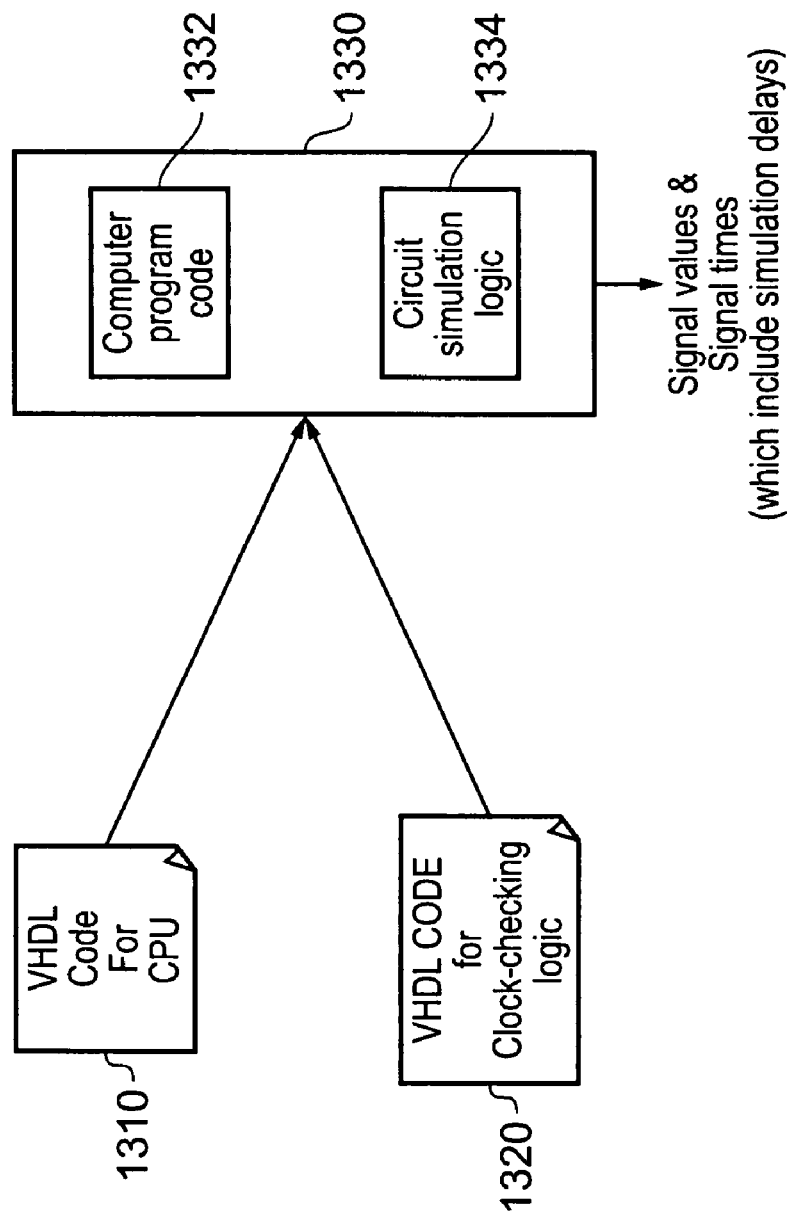
FIG. 13 schematically illustrates simulation of a data processing apparatus using code modules of a hardware description language.

FIG. 13 schematically illustrates the further implementation of the clock-signal comparator according to the present technique. The system of FIG. 13 illustrates simulation of a data processing apparatus having a plurality of processing units. Such simulations are often performed prior to fabrication of a circuit.

Simulation of the data processing apparatus involves defining a plurality of code modules written in a hardware description language such as VHDL (Very high speed integrated circuit Hardware Description Language), RTL (Register Transfer Level) or VERILOG. Hardware description languages are essentially programming languages that describe a logic circuit by function, data flow behaviour and/or structure.

Once a circuit module has been designed in the hardware description language, a simulation is performed to assess the operation of the circuit design and this simulation allows signal values and signal times to be taken into account when considering the efficiency of the design. Execution of a hardware description language program results in a simulation of a circuit and allows the circuit design to be validated prior to fabrication. The hardware description language code is executed on an event simulator, which models the passage of time and the occurrence of events at various points in time. It stores signal values and corresponding signal timings that occur the simulation for subsequent analysis.

As shown in FIG. 13 according to one embodiment, a VHDL code module is defined to describe the operation of a CPU 1310 and a further VHDL code module 1320 is defined to describe the operation of the clock checking logic of FIG. 2A. These VHDL code modules are executed on an event simulator 1330. The event simulator 1330 comprises computer program code 1332 and circuit simulation logic 1334. Execution of the modules 1310 and 1320 on the event simulator results in generation of signal values and signal times representing the output of the hardware circuit that the hardware description language modules together were designed to represent.

The clock checking logic VHDL module 1320 enables clock skew to be detected where it has arisen as a result of incorrectly balanced clocks in the circuit design per se. However, the clock checking logic in this hardware description language implementation can also be used to check for timing errors that have arisen due to simulation artefacts. An example of such timing errors is that it is as follows: it is known that clock gates can be expressed in VERILOG without introducing any delay into the simulated gated clock, but in VHDL the same clock gate will introduce a so called "delta delay" when expressed in an equivalent way. If a simulation of a data processing apparatus gives rise to such simulation artefacts in the signal timings, then it is possible that these simulation artefacts could in fact mask errors in implementation of the logic. Thus the simulation results could appear favourable, but when the circuit is actually fabricated and tested errors in operation occur.

The clock checking logic according to the present technique can be implemented in the hardware description language code and thus form part of the simulation. This checking logic can be used to check for simulation artefacts (e.g. delta delays) in addition to actual physical delays arising from the circuit design itself.

Although illustrative embodiments have been described in detail herein with reference to the accompanying drawings, it is to be understood that the claims are not limited to those precise embodiments, and that various changes and modifications can be effected therein by one skilled in the art without departing from the scope and spirit of the invention as defined by the appended claims.

We claim:

1. An integrated circuit comprising:
processing logic circuitry; and
a clock-signal comparator having:
a reference input port for receiving a reference clock signal;
at least one further input port for receiving a respective further clock signal; and
checking logic circuitry configured to check for a correspondence between a clock edge of said reference clock signal and a corresponding clock edge of said further clock signal within a predetermined time window;
wherein said checking logic circuitry is configured to check for said correspondence during operation of said integrated circuit, wherein said checking logic circuitry comprises a reference signal path and a further signal path, and wherein said further signal path comprises at least one data-capture element clocked by said reference clock and at least one data-capture element clocked by said further clock.

2. Integrated circuit according to claim 1, wherein said checking logic circuitry is configured to detect within said predetermined time window at least one of: (i) a missing clock edge in said reference clock signal; and (ii) a time difference exceeding said predetermined time window between an arrival of said clock edge of said reference clock signal and an arrival of said corresponding clock edge of said further clock signal.

3. Integrated circuit according to claim 1, wherein said processing logic circuitry comprises a subset of logic circuitry clocked by said reference clock signal and a subset of logic circuitry clocked by said further clock signal.

4. Integrated circuit according to claim 1, wherein said checking logic circuitry is configured to detect a plurality of different magnitudes of clock skew.

5. Integrated circuit according to claim 1, wherein said reference signal path comprises at least one data-capture element clocked by said reference clock.

6. Integrated circuit according to claim 5, wherein said at least one data-capture element of said further signal path clocked by said reference clock and said at least one data-capture element of said reference signal path clocked by said reference clock are configured to capture data on an active edge of said reference clock and said at least one data-capture element clocked by said further clock is operable to capture data on an active edge of said further clock.

7. Integrated circuit according to claim 6, wherein said active edge is at least one of: (i) a negative clock edge; and (ii) a positive edge of a corresponding one of said reference clock signal and said further clock signal.

8. Integrated circuit according to claim 6, wherein at least one of said at least one data capture elements comprises an enable input for receiving a respective enable signal, said enable signals indicating which of said clock edges of the respective reference clock signal and further clock signal are to be used by said integrated circuit for synchronising communication between a reference domain of said integrated circuit clocked by said reference clock signal and a further domain of said integrated circuit clocked by said further clock signal.

9. Integrated circuit according to claim 8, wherein each of said enable signals is used to identify active edges of at least one of said reference clock signal and said further clock signal.

10. Integrated circuit according to claim 8, wherein each of said enable signals is synchronous with respect to at least one of said reference clock signal and said further clock signal.

11. Integrated circuit according to claim 5, wherein at least one of said reference signal path and said further signal path comprises at least one data-delay element for delaying in time an arrival of data at an associated one of said at least one data-capture elements.

12. Integrated circuit according to claim 1, wherein at least one of said data-capture elements is a flip-flop.

13. Integrated circuit according to claim 1, comprising a transition generator configured to send a transition signal along said reference signal path and said further signal path.

14. Integrated circuit according to claim 13, wherein at least one of said transition generator and said checking logic circuitry is clocked by said reference clock signal.

15. Integrated circuit according to claim 13, wherein said checking logic circuitry is configured to detect a coincidence of a transition associated with said further signal path and a transition associated with said reference signal path.

16. Integrated circuit according to claim 13, wherein said checking logic circuitry is configured to detect if a transition edge of said transition signal output by said reference signal path has the same polarity as a corresponding transition edge of said transition signal output by said further signal path.

17. Integrated circuit according to claim 13, wherein said checking logic circuitry is configured to detect if a transition edge of said transition signal output by said reference signal path has a different polarity from a corresponding transition edge of said transition signal output by said further signal path and to output a signal indicating that said clock edge and said corresponding clock edge have different polarities.

18. Integrated circuit according to claim 14, wherein said transition generator is configured to generate said transition signal such that a transition substantially coincides in time with at least one of an active clock edge of said reference clock signal or an active clock edge of said further clock signal.

19. Integrated circuit according to claim 18 wherein said transition signal comprises a regular sequence of alternating transitions.

20. Integrated circuit according to claim 18, wherein said transition signal comprises a sequence of alternating transitions, said sequence having at least one perturbation.

21. Integrated circuit according to claim 20, wherein said transition generator is configured to generate said perturbation in said transition signal such that a transition occurs substantially coincident with an active edge of said further clock signal such that it has opposite polarity to the most recent preceding transition that was coincident with an active edge of said further clock signal and the level of said transition signal at any intervening active edges of said further clock signal that were not coincident with a transition in said transition signal did not cause a change in the output of the further signal path.

22. Integrated circuit according to claim 18 wherein said transition signal is controlled in dependence upon at least one of: (i) information with regard to expected timings of clock edges of said further clock; and (ii) feedback from said further clock signal indicating timings of clock edges of said further clock.

23. Integrated circuit according to claim 1, wherein said reference clock signal has a reference frequency and said further clock signal has a further frequency, said reference frequency being a non-zero integer multiple of said further frequency.

24. Integrated circuit according to claim 1, wherein at least one of said reference clock signal and said further clock signal is gated for at least one clock cycle.

25. Integrated circuit according to claim 24, wherein one of said reference clock signal and said further clock signal is a gated clock signal whilst the other is a non-gated clock signal and wherein a gated region of said gated clock signal occurs away from an active edge of said non-gated clock signal.

26. Integrated circuit according to claim 1, wherein said integrated circuit is implemented in a programmable logic device.

27. Integrated circuit according to claim 26, wherein said programmable logic device is a Field Programmable Gate Array.

28. Integrated circuit according to claim 1, wherein said integrated circuit is implemented in a non-programmable logic device.

29. Integrated circuit according to claim 1, wherein said integrated circuit is implemented in an Application Specific Integrated Circuit.

30. Integrated circuit according to claim 1, wherein said further clock signal is generated by a first clock and said reference clock signal is generated by a second clock that is independent from said first clock.

31. Integrated circuit according to claim 1, wherein said further clock signal is generated by a first clock and said reference clock signal is generated by a second clock and wherein said first clock and said second clock are related such that one of said first clock and said second clock is derived from the other of said first clock and said second clock.

32. Integrated circuit according to claim 31, wherein one of said first clock and said second clock is a gated version of the other of said first clock and said second clock.

33. Integrated circuit according to claim 1, wherein said reference clock signal and said further clock signal are generated at physically different locations in said integrated circuit in dependence upon a common clock.

34. A method for detecting a time difference between clock edges in an integrated circuit, said method comprising the steps of:
  receiving a first clock signal at a first input port;
  receiving a second clock signal at a second input port;
  checking for a correspondence between a clock edge of said first clock signal and a corresponding clock edge of said second clock signal within a predetermined time window;

wherein said checking is performed during operation of said integrated circuit;
wherein said checking is performed by checking logic comprising a reference signal path and a further signal path; and
wherein said further signal path comprises at least one data capture element clocked by said first clock signal and at least one data capture element clocked by said second clock signal.

35. Apparatus for processing data comprising:
a first set of processing logic circuitry corresponding to a first clock domain clocked by a first clock signal;
a second set of processing logic circuitry corresponding to a second clock domain clocked by a second clock signal;
a frequency controller configured to vary a frequency of at least one of said first clock signal and said second clock signal;
a clock-signal comparator having:
a first input port for receiving said first clock signal;
a second input port for receiving said second clock signal; and
checking logic circuitry configured to check for a correspondence between a clock edge of said first clock signal and a corresponding clock edge of said second clock signal within a predetermined time window;
wherein said checking logic circuitry is configured to check for said correspondence during operation of said data processing apparatus;
wherein said apparatus further comprises a synchroniser configured in an asynchronous mode of said data processing apparatus to synchronise communication between said first clock domain and said second clock domain.

36. Apparatus according to claim 35, comprising control logic circuitry to perform at least one of the following control tasks:
to disable said synchronous mode when said checking logic circuitry indicates that said correspondence between a clock edge of said first clock signal and a corresponding clock edge of said second clock signal is not sufficiently close to enable reliable synchronous communication; and
to enable said synchronous mode when said checking logic circuitry indicates that said correspondence between a clock edge of said first clock signal and a corresponding clock edge of said second clock signal is sufficiently close to enable reliable synchronous communication.

37. Apparatus according to claim 35, wherein at least one of said first set of processing logic circuitry and said second set of processing logic circuitry is a processor core.

38. Apparatus according to claim 37, wherein said frequency controller is configured to selectively vary a frequency of said processor core.

39. Apparatus according to claim 35, wherein said further clock signal is generated by a first clock and said reference clock signal is generated by a second clock that is independent from said first clock.

40. Apparatus according to claim 35, wherein said further clock signal is generated by a first clock and said reference clock signal is generated by a second clock and wherein said first clock and said second clock are related such that one of said first clock and said second clock is derived from the other of said first clock and said second clock.

41. Apparatus according to claim 35, wherein one of said first clock and said second clock is a gated version of the other of said first clock and said second clock.

42. A computer-readable medium comprising a hardware description model of a circuit in a hardware description language, said hardware description model comprising representations of:
a clock-signal comparator having:
a reference input port for receiving a reference clock signal;
at least one further input port for receiving a respective further clock signal; and
checking logic circuitry configured to check for a correspondence between a clock edge of said reference clock signal and a corresponding clock edge of said further clock signal within a predetermined time window;
wherein said checking logic circuitry is configured to check for said correspondence during operation of said circuit, wherein said checking logic circuitry comprises a reference signal path and a further signal path, and wherein said further signal path comprises at least one data-capture element clocked by said reference clock and at least one data-capture element clocked by said further clock.

43. A computer program stored on a computer-readable medium, the computer program being for simulating the operation of a data processing apparatus having at least one processing unit, said computer program comprising:
hardware description language code comprising a plurality of hardware description language code modules representing respective ones of said at least one processing unit;
event simulator code configured to execute said hardware description language code to simulate operation of said data processing apparatus and to generate a plurality of signal values and corresponding signal times for a respective plurality of simulated signals;
one of said plurality of hardware description language code modules representing a processing unit comprising:
a clock-signal comparator having:
a reference input port for receiving a reference clock signal corresponding to one of said plurality of simulated signals;
at least one further input port for receiving a respective further clock signal corresponding to a different one of said plurality of simulated signals; and
checking logic configured to check for a correspondence between a clock edge of said reference clock signal and a corresponding clock edge of said further clock signal within a predetermined time window;
wherein said checking logic circuitry is operable to check for said correspondence when said event simulator code is executing said hardware description language code, wherein said checking logic circuitry comprises a reference signal path and a further signal path, and wherein said further signal path comprises at least one data-capture element clocked by said reference clock and at least one data-capture element clocked by said further clock.

44. A method for checking for timing errors in a simulation of the operation of a data processing apparatus having at least one processing unit, said method comprising the steps of:
providing hardware description language code comprising at least one hardware description language code modules representing said at least one processing unit;
executing said hardware description language code on an event simulator to simulate operation of said data processing apparatus and generating a plurality of signal values and corresponding signal times for a respective plurality of simulated signals;

wherein one of said at least one hardware description language code module represents a processing unit comprising:

a clock-signal comparator having:

a reference input port for receiving a reference clock signal corresponding to one of said plurality of simulated signals;

at least one further input port for receiving a respective further clock signal corresponding to a different one of said plurality of simulated signals; and checking logic circuitry configured to check for a correspondence between a clock edge of said reference clock signal and a corresponding clock edge of said further clock signal within a predetermined time window; and wherein said checking logic circuitry is configured to identify said timing errors by checking for said correspondence when said event simulator code is executing said hardware description language code, wherein said checking logic circuitry comprises a reference signal path and a further signal path, and wherein said further signal path comprises at least one data-capture element clocked by said reference clock and at least one data-capture element clocked by said further clock.

* * * * *